US006956638B2

(12) United States Patent
Akiyama et al.

(10) Patent No.: US 6,956,638 B2
(45) Date of Patent: Oct. 18, 2005

(54) DISPLAY DEVICE AND METHOD OF MANUFACTURING THE SAME

(75) Inventors: Masahiko Akiyama, Tokyo (JP); Mitsuo Nakajima, Yokohama (JP); Tsuyoshi Hioki, Yokohama (JP); Yujiro Hara, Yokohama (JP); Yutaka Onozuka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/991,508

(22) Filed: Nov. 19, 2004

(65) Prior Publication Data

US 2005/0088595 A1 Apr. 28, 2005

Related U.S. Application Data

(62) Division of application No. 10/388,615, filed on Mar. 17, 2003, now Pat. No. 6,831,727.

(30) Foreign Application Priority Data

Mar. 26, 2002 (JP) ........................................ 2002-084924

(51) Int. Cl.⁷ ........................... G02F 1/13; G02F 1/136; G02F 1/1333; H01L 29/04
(52) U.S. Cl. ........................ 349/187; 349/43; 349/122; 349/158; 257/59
(58) Field of Search ........................... 349/42, 43, 122, 349/158, 187; 257/59, 72; 438/30

(56) References Cited

U.S. PATENT DOCUMENTS

| 5,834,327 A | * 11/1998 | Yamazaki et al. ............ 438/30 |
| 6,078,365 A | 6/2000 | Ueda et al. .................... 349/43 |
| 6,559,905 B1 | 5/2003 | Akiyama ...................... 349/45 |
| 2003/0213956 A1 | 11/2003 | Hioki et al. .................. 257/59 |

FOREIGN PATENT DOCUMENTS

| JP | 5-61011 | 3/1993 |
| JP | 2001-7340 | 1/2001 |

OTHER PUBLICATIONS

T. Hioki, et al., IDW Proceedings, pp. 319–322, "A Flexible 8.4–In. Color Low–Temperature Poly–Si TFT–LCD", Dec. 4, 2002.

* cited by examiner

Primary Examiner—Tarifur R. Chowdhury
(74) Attorney, Agent, or Firm—Oblon, Spivak, McClelland, Maier & Neustadt, P.C.

(57) ABSTRACT

A display device comprises a first plastic substrate, a first adhesion layer formed in a first region of the first plastic substrate, the first region being a region where a pixel region is to be formed thereon, a second adhesion layer formed in a peripheral region outside of the first region of the first plastic substrate, a first thin glass layer formed on the first and second adhesion layers, a plurality of active elements formed on the first thin glass layer in one-to-one relation with a plurality of pixels, a display part formed on the first thin glass layer, the display part corresponding to the pixel region and being driven by the plurality of active elements, and an opposing substrate formed over the display part.

8 Claims, 32 Drawing Sheets

DISPLAY DEVICE AND METHOD OF MANUFACTURING THE SAME

CROSS-REFERENCE TO RELATED APPLICATIONS

This application is a divisional of U.S. application Ser. No. 10/388,615, filed Mar. 17, 2003, now U.S. Pat. No. 6,831,727, and is based upon and claims the benefit of priority from the prior Japanese Patent Application No. 2002-084924, filed Mar. 26, 2002, the entire contents of each of which are incorporated herein by reference.

BACKGROUND OF THE INVENTION

1. Field of the Invention

The present invention relates to a display device and a method of manufacturing the same.

2. Description of the Related Art

An active matrix type display device in which an active element such as a thin-film transistor (TFT) is placed in each pixel can realize a high-quality, flat display device. In a display part of this active matrix type display device, it is possible to use, e.g., a liquid crystal which functions as a light shutter, an organic EL which emits light, or an electrophoretic element encapsulated in a microcapsule. These active matrix type display devices can be made thin and light in weight, so they are optimum for portable information apparatuses such as a notebook model personal computer and PDA (Portable Digital Assistance).

In a TFT used as an active element, a semiconductor film made of, e.g., amorphous silicon, polycrystalline silicon, crystalline silicon in which lattice continuity is obtained in the grain boundary, or single-crystal silicon is used as an active layer. In the fabrication of these TFTs, to improve the film quality of a semiconductor film, gate insulating film, and the like, a process temperature of about 250 to 350° C. is required for amorphous silicon, and about 400 to 650° C. for highly crystalline silicon such as polycrystalline silicon. Since this restricts the substrate material, glass substrates such as non-alkaline glass have been conventionally used.

Portable information apparatuses will be widely used with the development of radio networks in the future, so display devices are required to be made thinner and lighter in weight. To meet this requirement, active matrix type display devices using a plastic substrate instead of a glass substrate are proposed.

As an example of these active matrix type display devices using a plastic substrate, a method is reported in which a TFT is formed at as a low process temperature as possible by improving the heat resistance of a plastic substrate. Since the specific gravity of a plastic substrate is half that of a glass substrate or less, the weight of the display device can be reduced. In addition, the flexibility of plastic makes the display device bendable, and this increases the impact resistance.

Unfortunately, a plastic substrate not only has a low heat resistance of about 100° C. to 200° C. but also deforms by moisture absorption. Also, the coefficient of linear expansion of a plastic substrate is larger by an order of magnitude than that of a glass substrate. These tendencies are particularly conspicuous in a transparent plastic substrate necessary for a display device. For these reasons, peeling or disconnection occurs when active elements and the like are formed on a plastic substrate. Additionally, the mask alignment accuracy lowers because layers of active elements are stacked on a plastic substrate which deforms. When a plastic substrate is used, therefore, it is impossible to form such high-accuracy patterns as formed when active elements and the like are formed on a glass substrate. Also, the use of a plastic substrate lowers the performance of pixel switches and driving circuits in a display part using TFTs. Furthermore, when a plastic substrate is used, many limitations are imposed on usable materials because cracks are easily formed if brittle metals or insulating materials are used.

As another example of the active matrix type display devices using a plastic substrate, a method in which TFTs formed on a glass substrate or silicon substrate are transferred onto a plastic substrate is proposed in, e.g., Jpn. Pat. Appln. KOKAI Publication No. 2001-7340 (U.S. Pat. No. 5,834,327). This conventional transfer method will be explained below with reference to FIGS. 1A to 1E.

First, as shown in FIG. 1A, a separation layer 1302 such as an insulating film which functions as an etching stopper is formed on an element formation substrate 1301 made of, e.g., glass. On this separation layer 1302, elements 1303 such as TFTs 1308 and electrodes 1309 are formed using a conventional process.

Next, as shown in FIG. 1B, a temporary adhesion layer 1304 having adhesion properties is formed on an intermediate substrate 1305, and the elements 1303 formed on the element formation substrate 1301 are bonded to this intermediate substrate 1305 via the temporary adhesion layer 1304.

As shown in FIG. 1C, the element formation substrate 1301 is removed by etching or the like so that the separation layer 1302 remains.

As shown in FIG. 1D, an adhesion layer 1306 having adhesion properties is formed on a final substrate 1307 to be transferred which is made of plastic. The separation layer 1302 is bonded to this final substrate 1307 via the adhesion layer 1306.

Finally, as shown in FIG. 1E, the temporary adhesion layer 1304 is, e.g., solved by a solvent to transfer the elements 1303 from the intermediate substrate 1305 onto the final substrate 1307.

In the above transfer method, glass or the like having high heat resistance can be used as the material of the element formation substrate 1301. Hence, the method can presumably form high-performance TFTs with high accuracy.

In this method, the element formation substrate 1301 is completely removed. Therefore, if the separation layer 1302 which remains has holes or if an excessively thin region is formed in this separation layer 1302 and etched together with the element formation substrate 1301, there is a possibility that the elements 1303 are damaged. Since the possibility of this damage is particularly high in large-screen, active matrix type display devices, the yield of such display devices may lower.

In addition, a liquid crystal or organic EL used as a display part significantly deteriorates because plastic used as the final substrate 1307 allows easy permeation of water and oxygen. Accordingly, it is necessary to stop water and oxygen as much as possible by forming, e.g., an inorganic barrier layer, which stops gases, on the plastic substrate.

As described above, it is conventionally difficult to obtain an active matrix type display device in which active elements can be formed with high yield by using a plastic substrate which is light in weight. Therefore, it is being desired to realize an active matrix type display device in which active elements can be formed with higher yield by using a plastic substrate which is light in weight, and realize a method of manufacturing the same.

BRIEF SUMMARY OF THE INVENTION

A display device according to a first aspect of the invention is a display device comprising:

a first plastic substrate;

a first adhesion layer formed in a first region of the first plastic substrate, the first region being a region where a pixel region is to be formed thereon;

a second adhesion layer formed in a peripheral region outside of the first region of the first plastic substrate;

a first thin glass layer formed on the first and second adhesion layers;

a plurality of active elements formed on the first thin glass layer in one-to-one relation with a plurality of pixels;

a display part formed on the first thin glass layer, the display part corresponding to the pixel region and being driven by the plurality of active elements; and an opposing substrate formed over the display part.

A display device according to a second aspect of the invention is a display device comprising:

a first plastic substrate provided for at least a pixel region;

a third plastic substrate provided for a peripheral region outside of the pixel region;

an adhesion layer formed at least on the first plastic substrate;

a first thin glass layer formed on the adhesion layer;

a plurality of active elements formed on the first thin glass layer in one-to-one relation with a plurality of pixels;

a display part formed on the first thin glass layer, the display part corresponding to the pixel region and being driven by the plurality of active elements; and an opposing substrate formed over the display part.

A display device manufacturing method according to a third aspect of the invention comprises:

forming active elements in one-to-one relation with pixels on an element formation substrate made of glass;

thinning the element formation substrate by polishing after the forming the active elements;

bonding the element formation substrate to a plastic substrate via a first adhesion layer in a pixel region and via a second adhesion layer in a peripheral region outside of the pixel region; and opposing the element formation substrate with an opposing substrate to form a display part driven by the active elements and displaying an image in units of pixels.

A display device manufacturing method according to a fourth aspect of the invention comprises:

forming active elements in one-to-one relation with pixels on an element formation substrate made of glass;

thinning the element formation substrate by polishing after the forming the active elements;

bonding a first plastic substrate to the element formation substrate at least in a pixel region via an adhesion layer, and bonding a third plastic substrate to the element formation substrate or the first plastic substrate in a peripheral region outside of the pixel region via the adhesion layer; and opposing the element formation substrate with an opposing substrate to form a display part driven by the active elements and displaying an image in units of pixels.

DETAILED DESCRIPTION OF THE INVENTION

Embodiments will be described in detail below with reference to the accompanying drawings.

(First Embodiment)

Figure 14A:
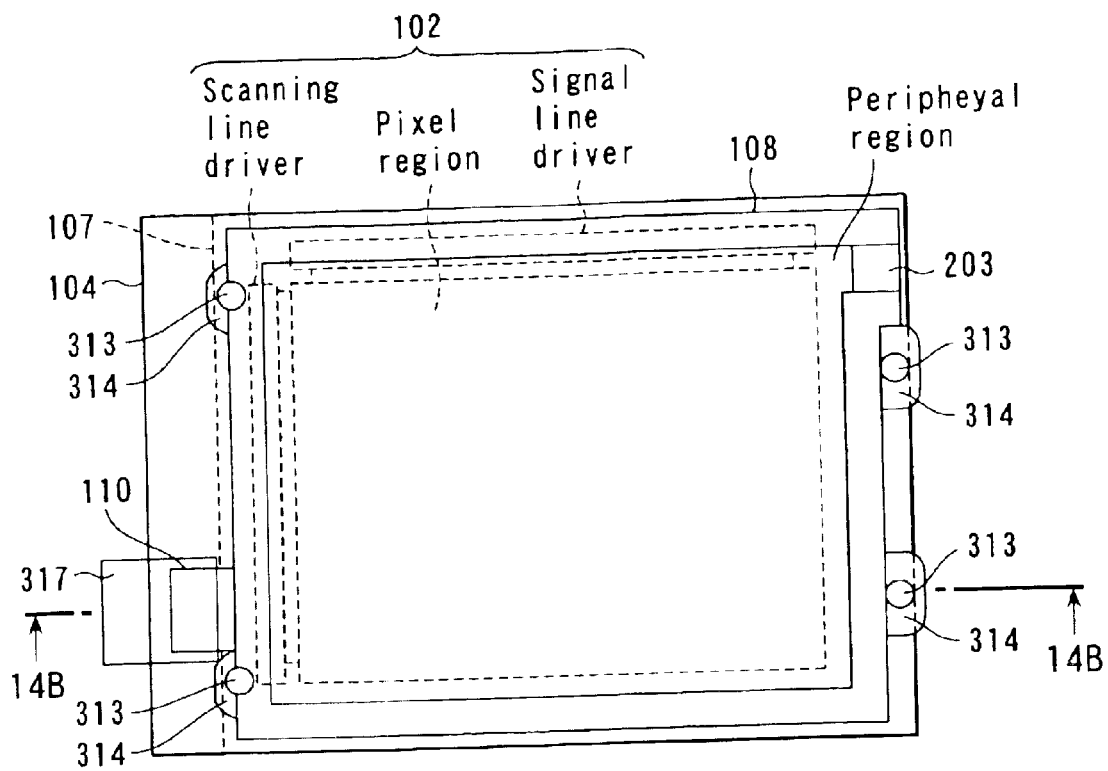
FIG. 14A is a plan view showing the element arrangement of the active matrix type display device of the first embodiment.
Figure 14B:
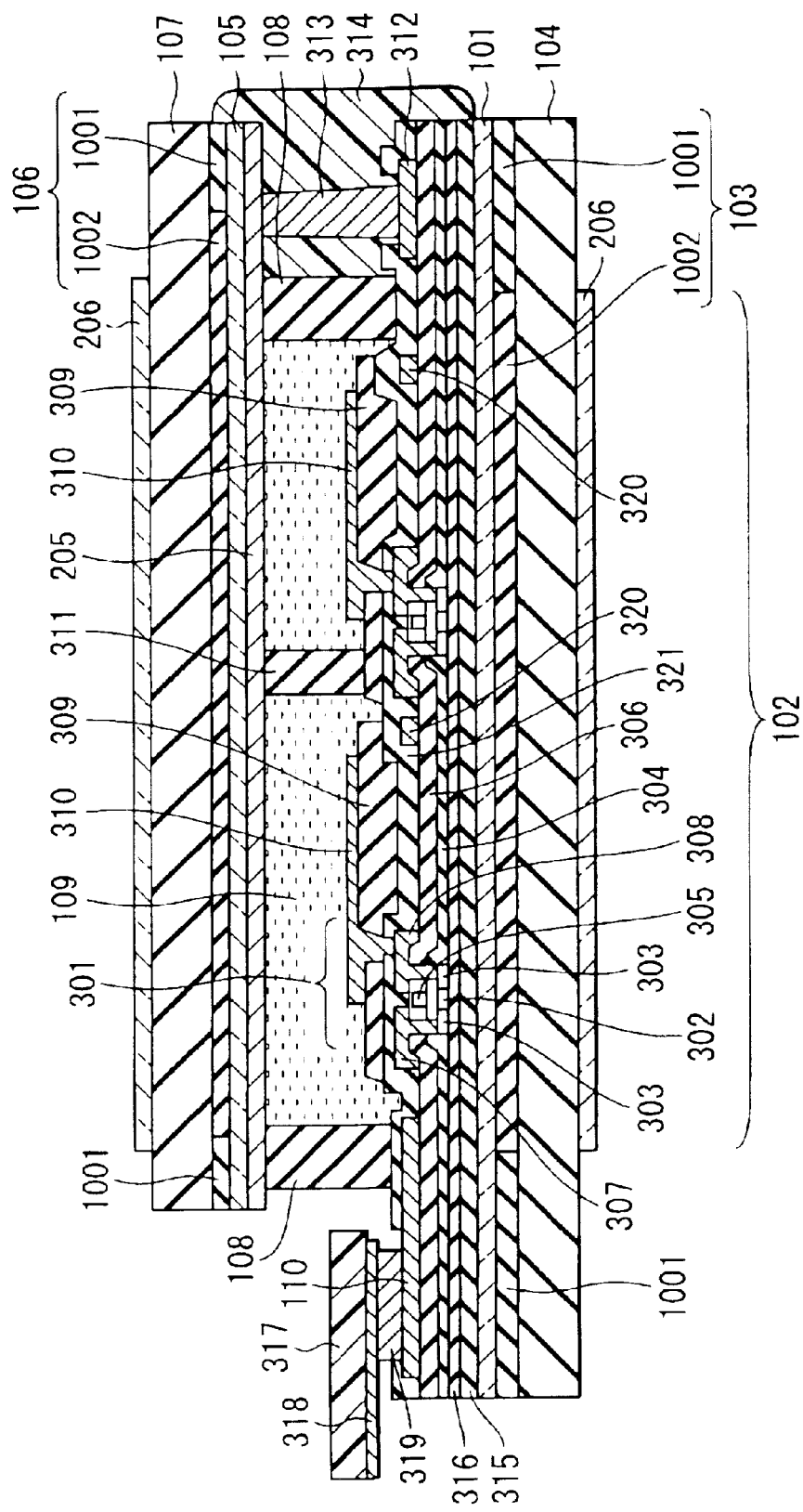
FIG. 14B is a sectional view taken along a line 14B—14B in FIG. 14A.

The arrangement of an active matrix type display device of the first embodiment is shown in FIGS. 14A and 14B. As indicated by a large rectangle of a dotted-line in FIG. 14A, a region on a substrate is divided into a pixel region and peripheral region. In the pixel region, active elements such as TFTs and pixel electrodes connected to these elements are formed into an array (not shown). In the peripheral region, a connecting pad electrode for connecting interconnections inside the substrate and interconnections extracted to the outside of the substrate is formed. Regions which are indicated by small rectangles of a dotted-line and in which a scanning line driver and signal line driver are formed are included in the pixel region in this embodiment. However, these regions may be formed in the peripheral region. In FIG. 14A, these drivers are formed in the peripheral region.

Figure 1A:
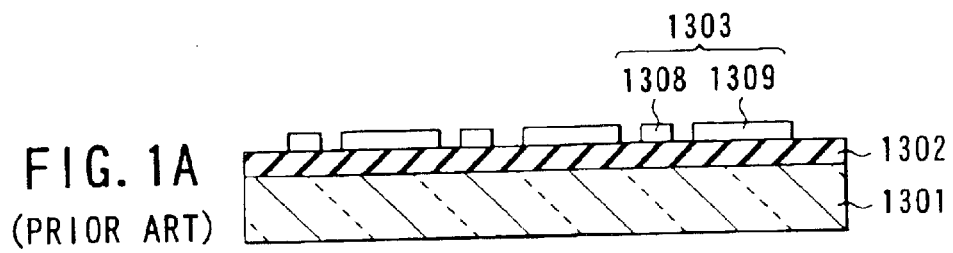
FIGS. 1A to 1E are sectional views showing the manufacturing steps of a conventional active matrix type display device step by step.
Figure 1B:
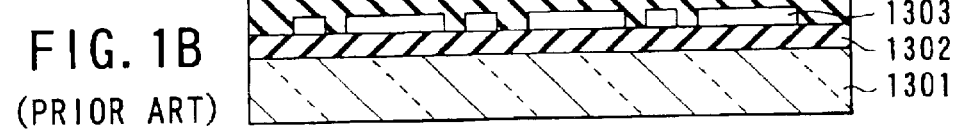
Figure 1C:
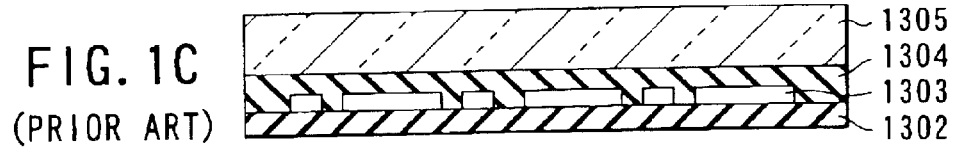
Figure 1D:
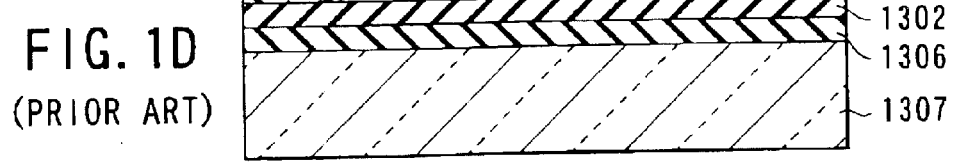
Figure 1E:
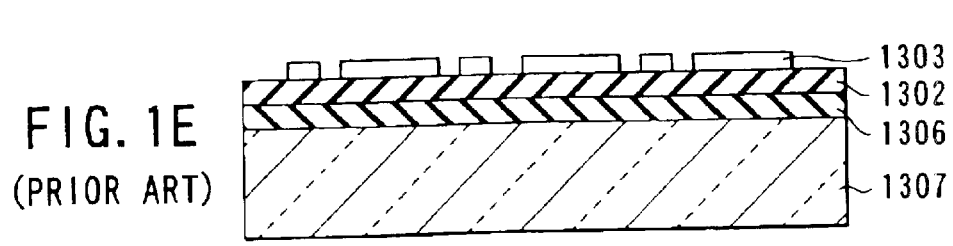
Figure 2A:
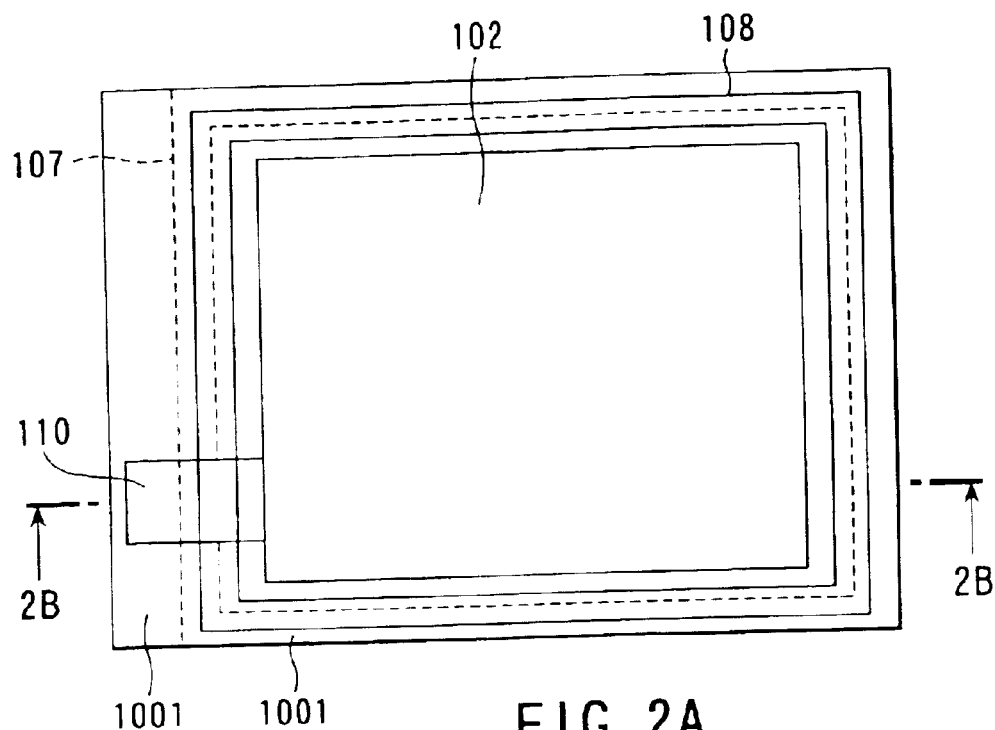
FIG. 2A is a plan view of an active matrix type display device according to the first embodiment of the present invention.
Figure 2B:
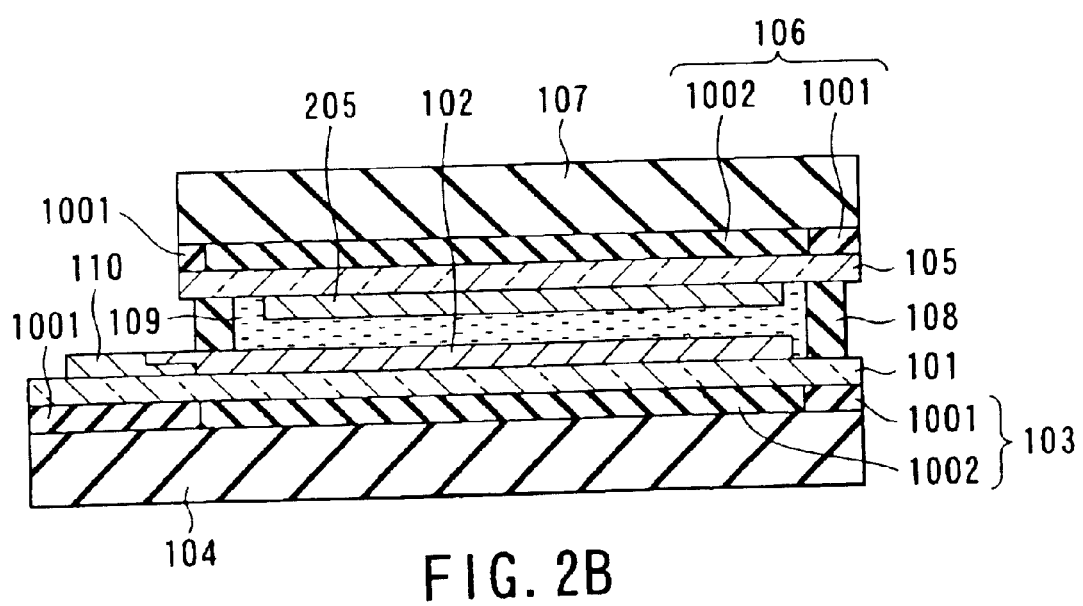
FIG. 2B is a sectional view taken along a line 2B—2B in FIG. 2A.

As shown in FIGS. 2A and 2B, the active matrix type display device of this embodiment includes a first plastic substrate 104, a first adhesion layer 103 formed on the first plastic substrate 104, and a first thin glass layer 101 having a thickness of 150 μm or less and formed on the first adhesion layer 103.

The first adhesion layer 103 has a pixel region adhesion layer 1002 formed in the pixel region and a peripheral region adhesion layer 1001 formed in the peripheral region around the pixel region on the first plastic substrate 104. The glass transition temperature of the pixel region adhesion layer 1002 is 30° C. (inclusive) to 80° C. (inclusive). The glass transition temperature of the peripheral region adhesion layer 1001 is higher by 10° C. or more than that of the pixel region adhesion layer 1002, and is 80° C. (inclusive) to 200° C. (inclusive).

On the first thin glass layer 101, an active element circuit region 102, a connecting pad electrode 110 connected to the active element circuit region 102, and a liquid crystal layer 109 (display part) are formed. This liquid crystal layer 109 is driven by the active element circuit region 102 in units of pixels. The connecting pad electrode 110 is formed on the peripheral region of the first glass layer 101.

Also, a second thin glass layer 105 is formed over the liquid crystal layer 109, a second adhesion layer 106 is formed on the second thin glass layer 105, and a second plastic substrate 107 is formed on the second adhesion layer 106. A common electrode 205 is formed on that surface of the second thin glass layer 105, which opposes the liquid crystal layer 109.

The thickness of the second thin glass layer 105 is 150 μm or less. The second adhesion layer 106 has a pixel region adhesion layer 1002 and peripheral region adhesion layer 1001. The pixel region adhesion layer 1002 is formed in the pixel region and has a glass transition temperature of 30° C. (inclusive) to 80° C. (inclusive). The peripheral region adhesion layer 1001 is formed in the peripheral region around the pixel region on the second thin glass layer 105, and has a glass transition temperature which is higher by 10° C. or more than that of the pixel region adhesion layer 1002, and is 80° C. (inclusive) to 200° C. (inclusive).

In this embodiment, in the pixel region, the glass transition temperature of the adhesion layer (pixel region adhesion layer 1002) between the plastic substrate and thin glass layer is lowered. In the peripheral region around the pixel region, the glass transition temperature of the adhesion layer (peripheral region adhesion layer 1001) is raised.

In the pixel region, the glass transition temperature is low and hence easily reached at a temperature slightly higher than a room temperature. At temperatures equal to or higher than this glass transition temperature, the adhesion layer softens, and this permits a difference produced by bending or the like between the thin glass layer and plastic substrate. This reduces the stress to the thin glass layer and prevents problems such as destruction. Even at temperatures lower than the glass transition temperature, the soft adhesion layer allows easy deformation, and this improves the impact resistance.

In the peripheral region, the glass transition temperature is high, and this suppresses deformation of the plastic substrate and prevents cracking of the thin glass layer on the edges. This can also prevent thermal stress when a flexible substrate is connected to the connecting pad electrode in the peripheral region via an anisotropic conductive layer at a temperature of about 200° C.

A method of manufacturing the active matrix type display device of this embodiment will be explained below with reference to FIGS. 3A and 3B to FIGS. 13A and 13B.

Figure 3A:
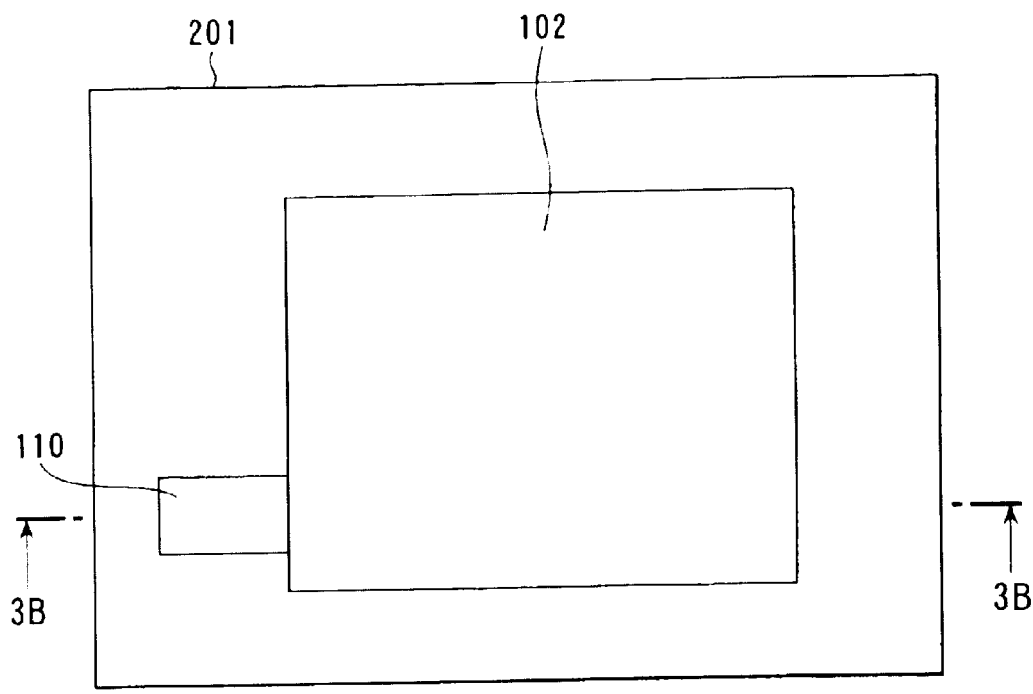
FIGS. 3A to 13B are views showing the manufacturing steps of the active matrix type display device according to the first embodiment step by step, in which views having suffix A are plan views, and views having suffix B are sectional views taken along lines designated by numbers suffixed with B in the corresponding plan views.
Figure 3B:
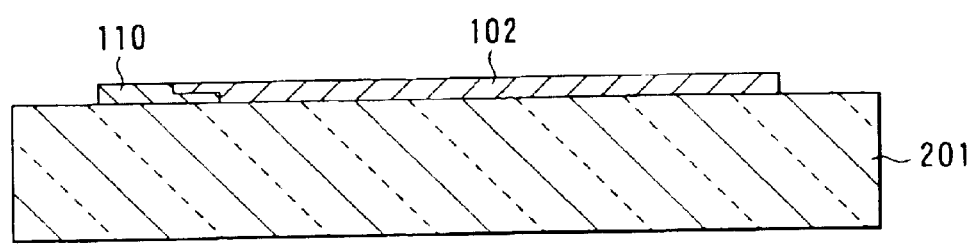

As shown in FIGS. 3A and 3B, an active element circuit region 102 is formed in a pixel region of a first non-alkaline glass substrate 201 about 0.7 mm thick. This active element circuit region 102 has a TFT array using low-temperature polysilicon as an active layer and peripheral driver circuits. In addition, a connecting pad electrode 110 for interconnections inside and outside the substrate is formed in a peripheral region.

Figure 4A:
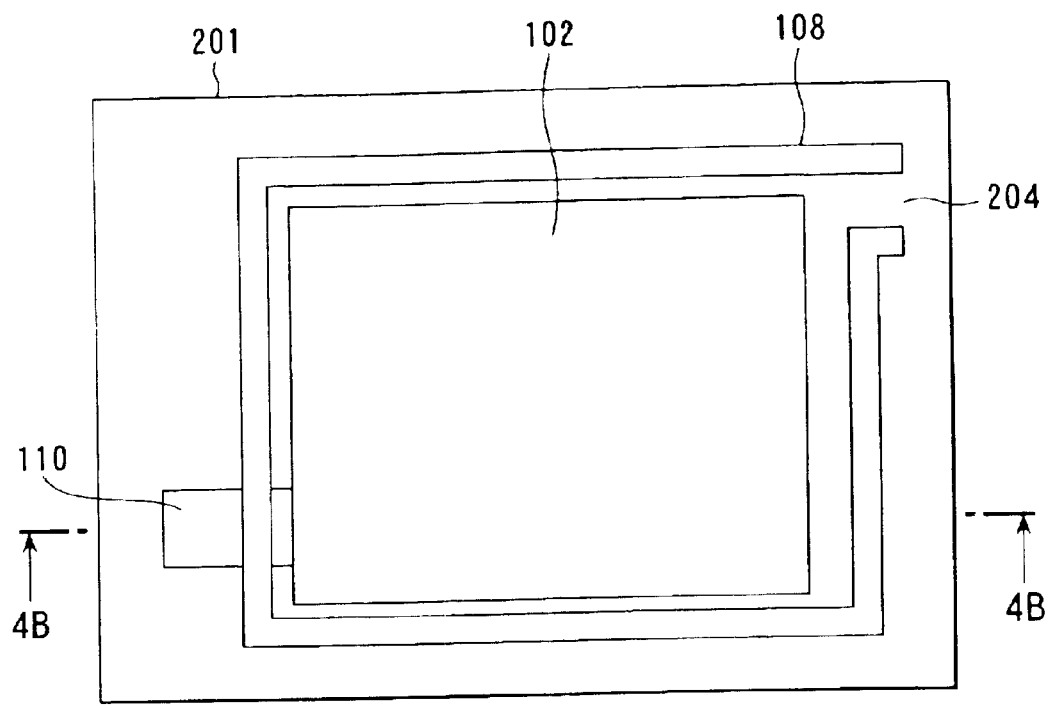
Figure 4B:
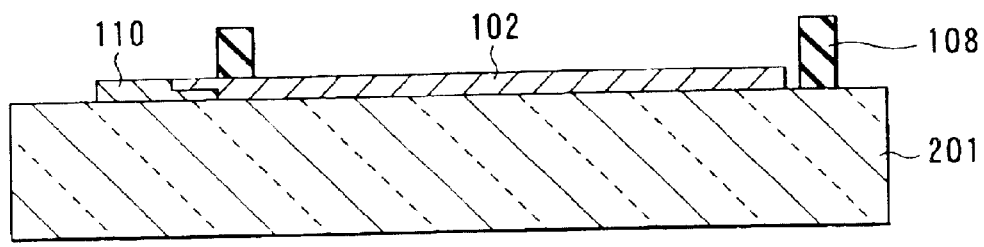

As shown in FIGS. 4A and 4B, a seal 108 is so formed as to surround the pixel region. This seal 108 is drawn with a dispenser by using an epoxy-based adhesive. The connecting pad electrode 110 is extended to the outside of the seal 108. An injection hole 204 for injecting a liquid crystal can be formed in the seal 108. However, a liquid crystal can also be injected without using an injection hole.

Figure 5A:
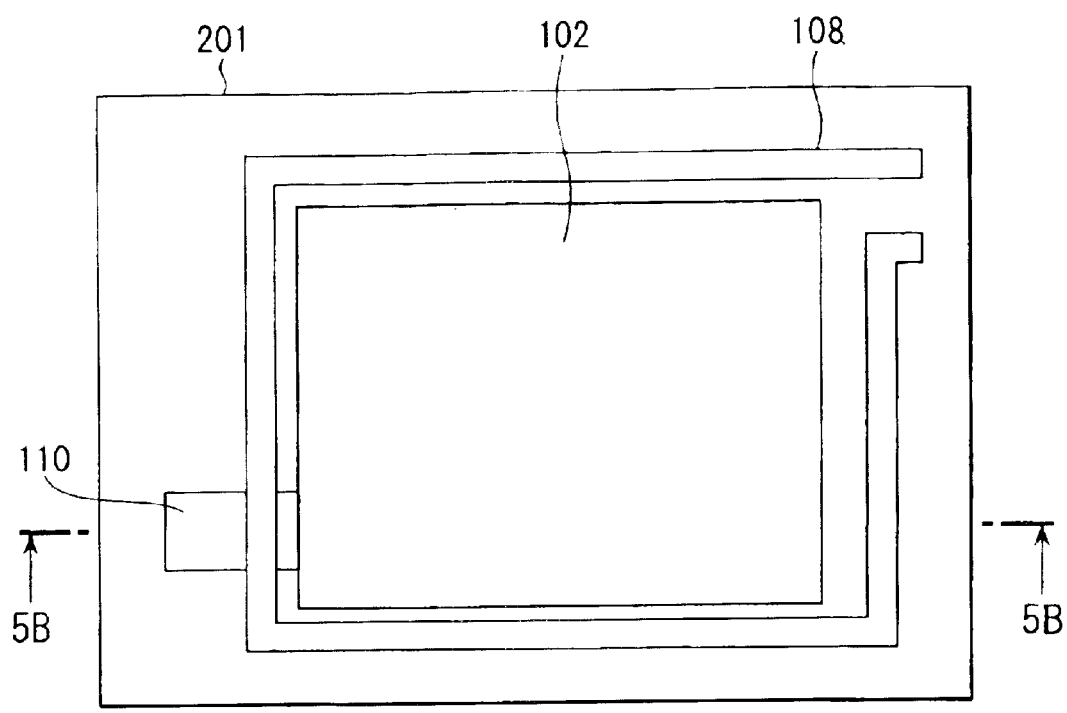
Figure 5B:
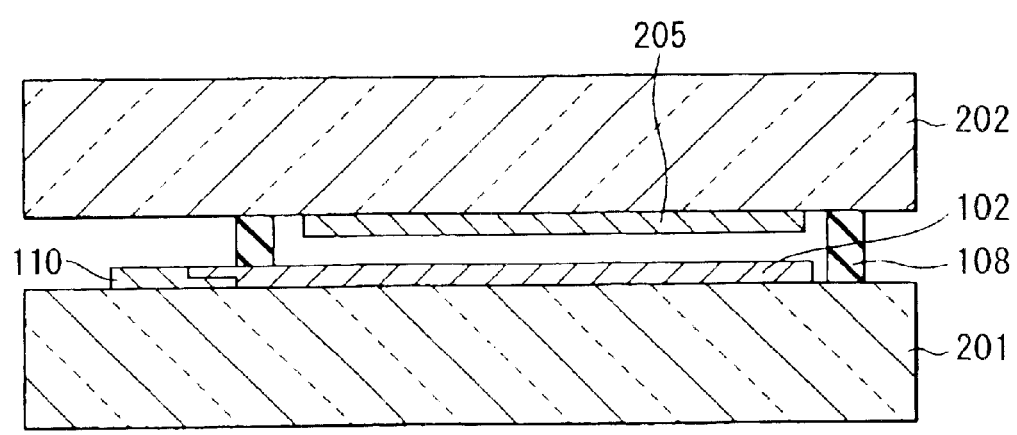

As shown in FIGS. 5A and 5B, a common electrode 205 made of a transparent conductive film such as ITO (Indium Tin Oxide) is formed by sputtering or the like on a second non-alkaline glass substrate 202 about 0.7 mm thick. This second non-alkaline glass substrate 202 and the first non-alkaline glass substrate 201 having the active element circuit region 102 and connecting pad electrode 110 formed on it are coupled and bonded by hardening the seal 108, such that the common electrode 205 and active element circuit region 102 oppose each other. Although not shown in the drawings, an alignment films are formed on the pixel electrode 102 and the common electrode 205, followed by rubbing. A good alignment film can be obtained at a processing temperature of 200° C. When a thermosetting type adhesive is used as the seal 108, this seal 108 is hardened at about 180° C. to 220° C. However, no problem arises because the glass substrates having high heat resistance are used. An ultraviolet ray curable adhesive for main sealing may be used as the seal 108.

Figure 6A:
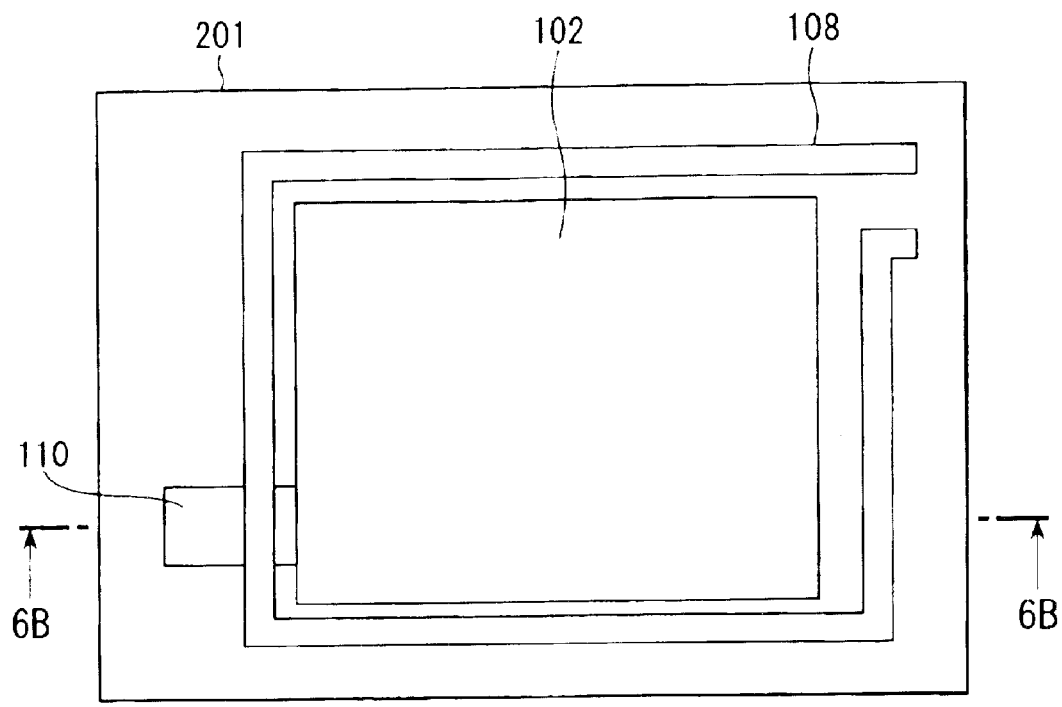
Figure 6B:
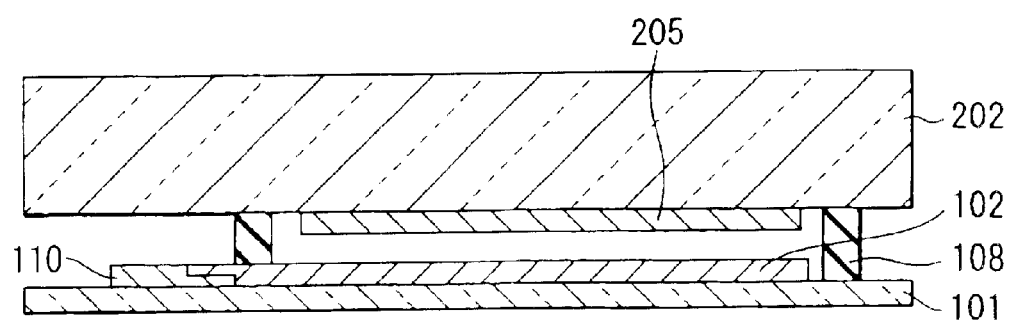

Next, the two non-alkaline glass substrates are thinned by polishing. In this embodiment, as shown in FIGS. 6A and 6B, the first non-alkaline glass substrate 201 on which the active element circuit region 102 is formed is first polished. This polishing is performed by chemical etching using a hydrofluoric-acid-based etchant, with the second non-alkaline glass substrate 202 and the side surfaces protected by a chemical-resistant sheet (not shown) or the like. Note that the thin film may be formed by mechanical polishing or chemical mechanical polishing (CMP).

In FIGS. 6 through 8, only the substrate 101 is polished, but both of the substrate 101 and 202 can be simultaneously polished. This makes the manufacturing process shorter.

When polishing of glass is performed, the material protecting the surroundings need not be a cover sheet. For example, glass polishing can be performed by temporarily fixing the substrates to a jig such as an appropriate plate member made of glass, hard plastic, metal, or ceramic, and the substrates can be removed from the jig after being polished. When the polished surface is bonded to a plastic substrate explained later with the substrate fixed to the jig, no mechanical force is applied to the thinned glass substrate. This effectively improves the yield.

The first non-alkaline glass substrate 201 is thinned to form a first thin glass layer 101 about 50 μm thick. That is, the first non-alkaline glass substrate 201 is not completely removed, but the glass layer is left behind as the first thin glass layer 101. This leaves no damage by removal of the first non-alkaline glass substrate 201 in the active element circuit region 102, so the mechanical strength can be maintained.

The thickness of the thinned glass is preferably 150 μm or less in accordance with the conditions such as the polishing accuracy, mechanical strength, and internal stress during the formation of active elements. If this thickness is more than 150 μm, the glass looses its flexibility to bending and easily cracks. If the glass thickness is too small, permeation of water and the like from the plastic substrate cannot be stopped, and this lowers the reliability. Therefore, the glass thickness is favorably about 1 μm or more.

Figure 7A:
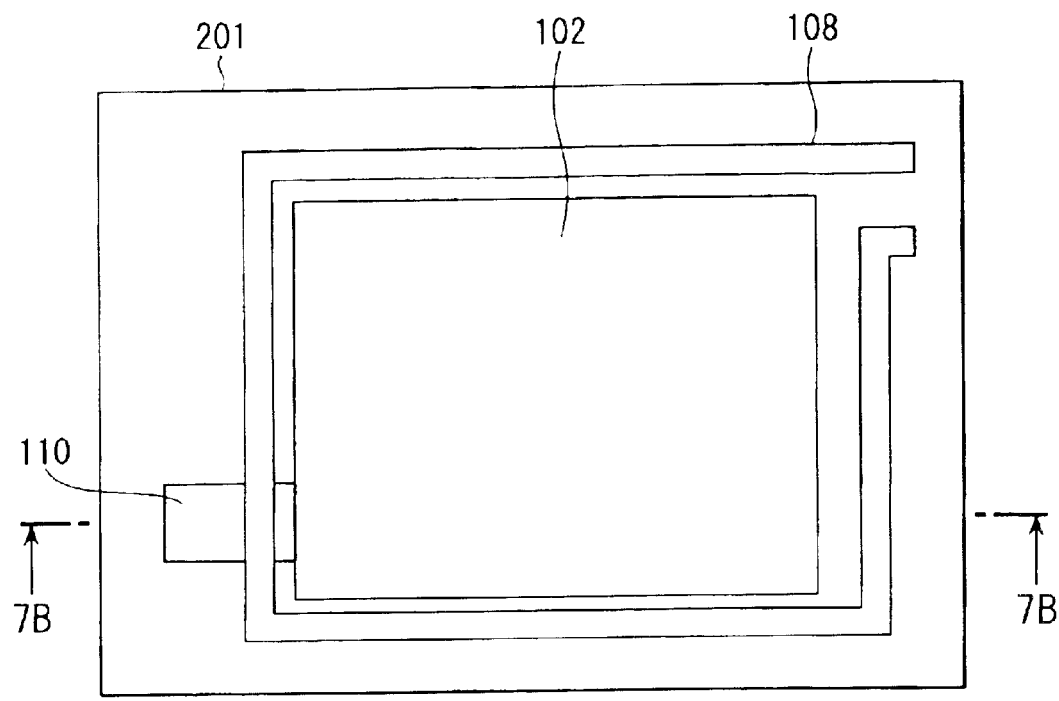
Figure 7B:
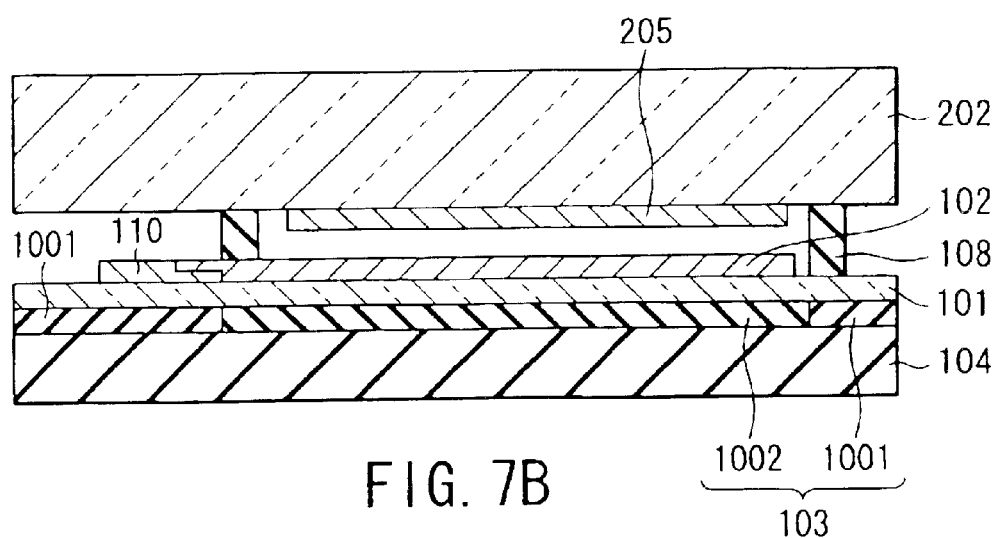

As shown in FIGS. 7A and 7B, the first thin glass layer 101 and a first plastic substrate 104 made of 0.1-mm thick PES (polyethersulfone) are bonded via a first adhesion layer 103. In this first adhesion layer 103, the characteristics of a peripheral region adhesion layer 1001 are different from those of a pixel region adhesion layer 1002. The peripheral region is a region which is outside the seal 108 and which has the edges and the region in which the connecting pad electrode 110 is formed.

In this embodiment, Photolec 720 manufactured by Sekisui Chemical Co., LTD. or TB3042 manufactured by THREE BOND CO., LTD. is used as the pixel region adhesion layer 1002. Photolec 720 is an allyl-based ultraviolet ray curable adhesive having a glass transition temperature of about 47° C. TB3042 is an acryl-based ultraviolet ray curable adhesive having a glass transition temperature of about 60° C.

As the peripheral region adhesion layer 1001, Structbond UC series manufactured by Mitsui Chemicals Inc. or 3025G manufactured by THREE BOND CO., LTD. is used. The glass transition temperatures of Structbond UC series and 3025G are about 109° C. and about 140° C., respectively.

The first adhesion layer 103 is formed to have a thickness of about 10 μm to 50 μm and hardened by irradiation with ultraviolet rays through the plastic substrate at a room temperature.

The pixel region adhesion layer 1002 desirably has a glass transition temperature of 30° C. (inclusive) to 80° C. (inclusive). For example, it is possible to use an acryl-based ultraviolet ray curable adhesive, allyl-based ultraviolet ray curable adhesive, thermosetting acryl-based adhesive, or thermosetting allyl-based adhesive.

The peripheral region adhesion layer 1001 desirably has a glass transition temperature which is higher by 10° C. or more than that of the pixel region adhesion layer 1002 and is 80° C. (inclusive) to 200° C. (inclusive). For example, it is possible to use an allyl-based ultraviolet ray curable adhesive, epoxy-based ultraviolet ray curable adhesive, or thermosetting epoxy-based adhesive.

Both the peripheral region adhesive 1001 and pixel region adhesive 1002 are preferably photo-setting type adhesives, since deformation upon adhesion is small. However, two-part adhesives, thermosetting type adhesives, or hot-melt type adhesives can also be used by properly selecting materials and conditions.

Since the peripheral region has no pixel, the peripheral region adhesion layer 1001 may be opaque, so the glass transition temperature may be raised by mixing fillers or the like. The glass transition temperature of the peripheral region adhesion layer 1001 is preferably higher by 10° C. or more than that of the pixel region adhesion layer 1002. Note that the peripheral region need not completely surround the pixel region, i.e., the peripheral region may be configured to surround the two or three sides, including the side on which the connecting pad electrode is formed, of the pixel region.

As the first plastic substrate 104, it is possible to use, e.g., polyether sulfone (PES), polyethylene naphthalate (PEN), polycarbonate (PC), or a polyolefin-based polymer such as cycloolefin polymer, acrylic resin, liquid crystal polymer, reinforced plastic mixed with an inorganic material, or polyimide. It is possible to appropriately select a thermoplastic resin, thermosetting resin, crystalline resin, or amorphous resin. Transparent or opaque plastic can also be used. PES or Arton which is a polyolefin-based resin manufactured by JSR Corporation is suitable for a liquid crystal because each material has small optical anisotropy and small birefringence. Also, an amorphous transparent resin is favored because its isotropy and flexibility are high. Note that the plastic substrate may be coated with a resin or inorganic film.

Figure 8A:
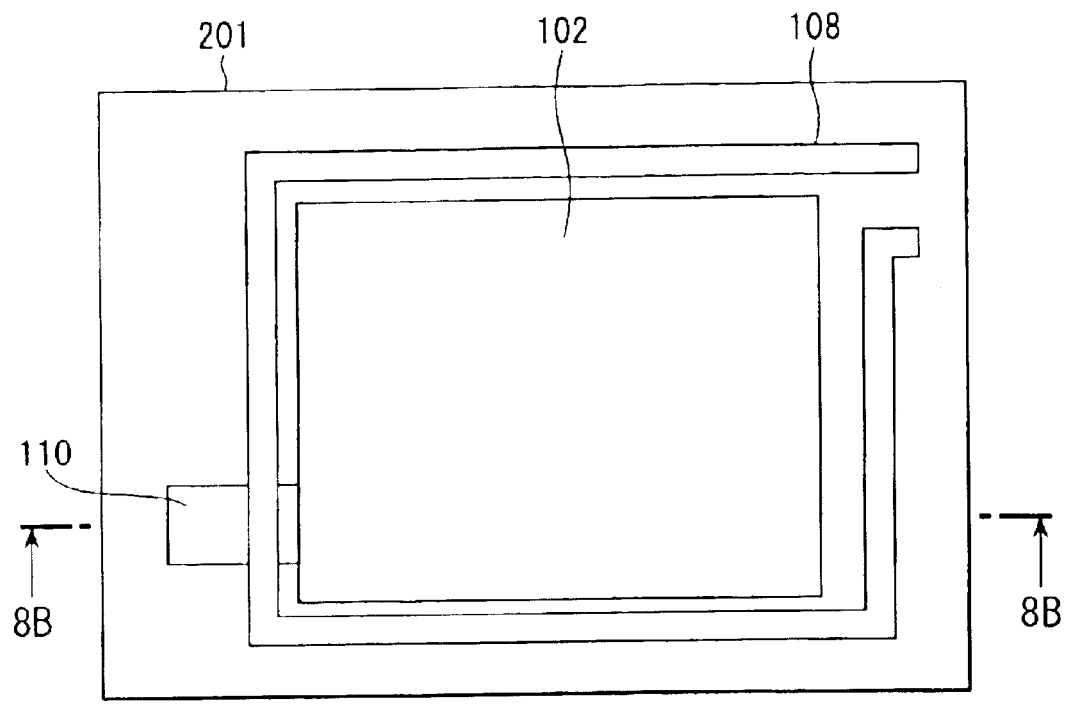
Figure 8B:
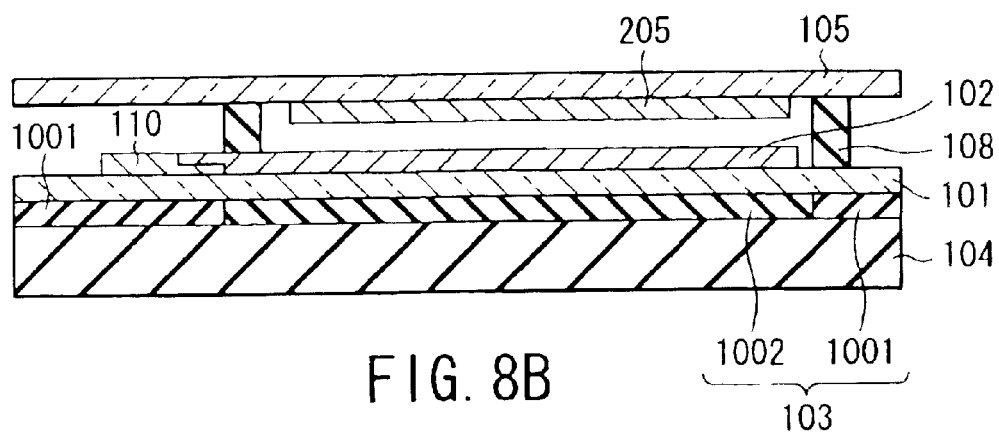

As shown in FIGS. 8A and 8B, the second non-alkaline glass substrate 202 is thinned by polishing to form a second thin glass layer 105. After the rear surface of the first plastic substrate 104 and the side surfaces including the first adhesion layer 103 and first thin glass layer 101 are protected with a chemical-resistant sheet (not shown), chemical etching is performed in the same manner as for the first non-alkaline glass substrate 201. The polishing method can be mechanical polishing or CMP. The thickness of the second thin glass layer 105 is preferably equivalent to that of the first thin glass layer 101, and is about 50 μm in this embodiment.

Figure 9A:
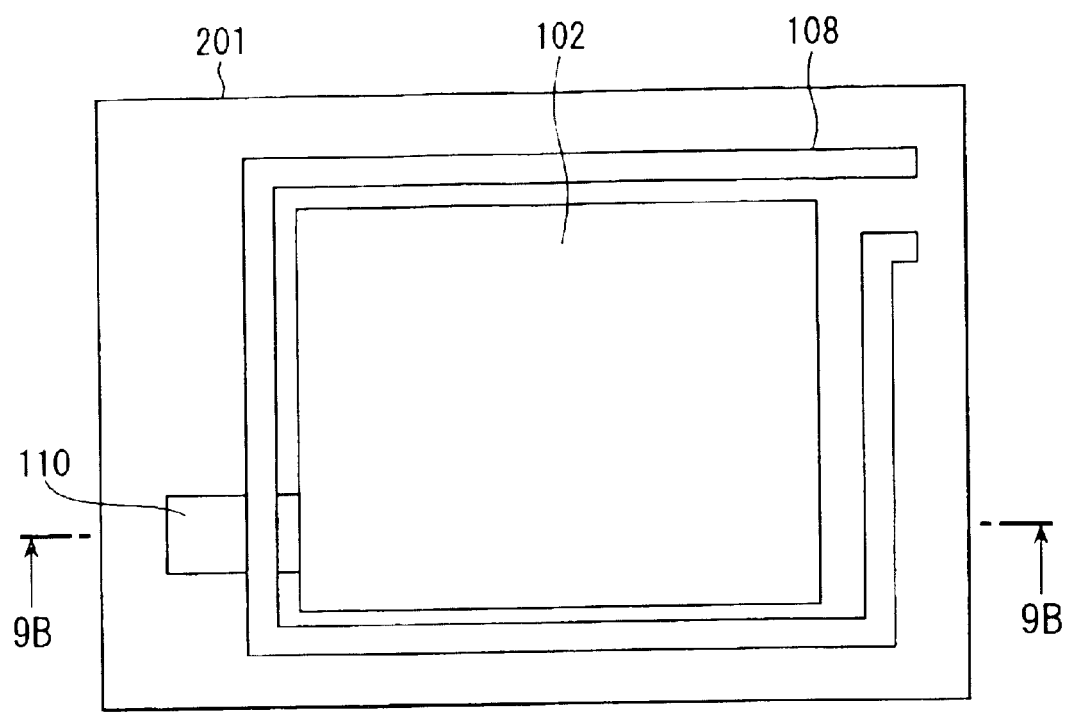
Figure 9B:
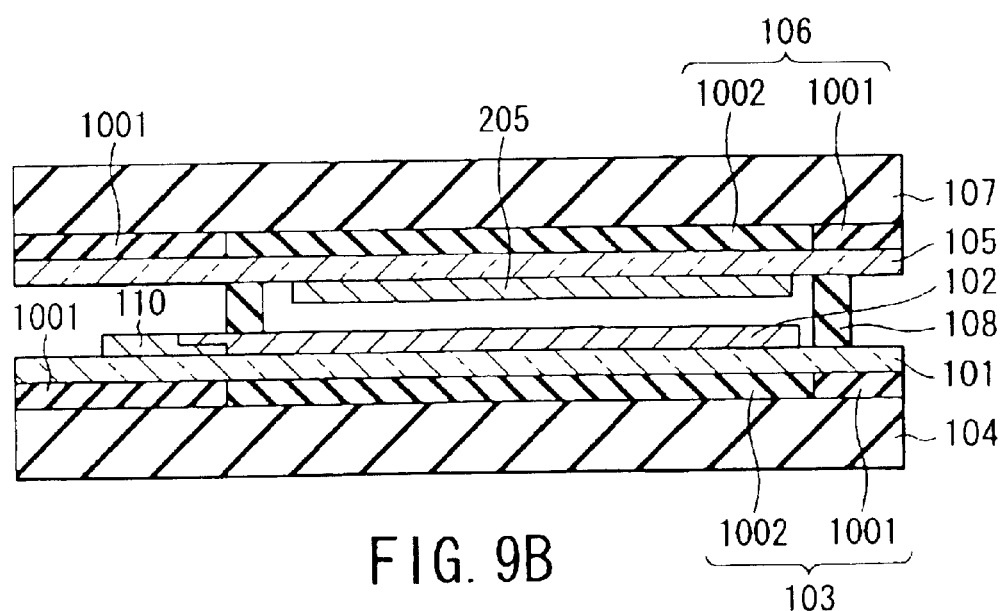

As shown in FIGS. 9A and 9B, a second plastic substrate 107 is bonded to the second thin glass layer 105 via a second adhesion layer 106. This second adhesion layer 106 also includes a peripheral region adhesion layer 1001 and pixel region adhesion layer 1002 having properties analogous to those of the first adhesion layer 103. That region of the second thin glass layer 105, which is outside the seal 108 is bonded to the second plastic substrate 107 by at least the peripheral region adhesion layer 1001.

In this embodiment, Structbond UC series manufactured by Mitsui Chemicals Inc. is used as the peripheral region adhesion layer 1001, and TB3042 manufactured by THREE BOND CO., LTD. is used as the pixel region adhesion layer 1002. The thickness of the adhesion layer 106 is 10 μm to 50 μm. The second plastic substrate 107 is 0.1-mm thick PES.

Figure 10A:
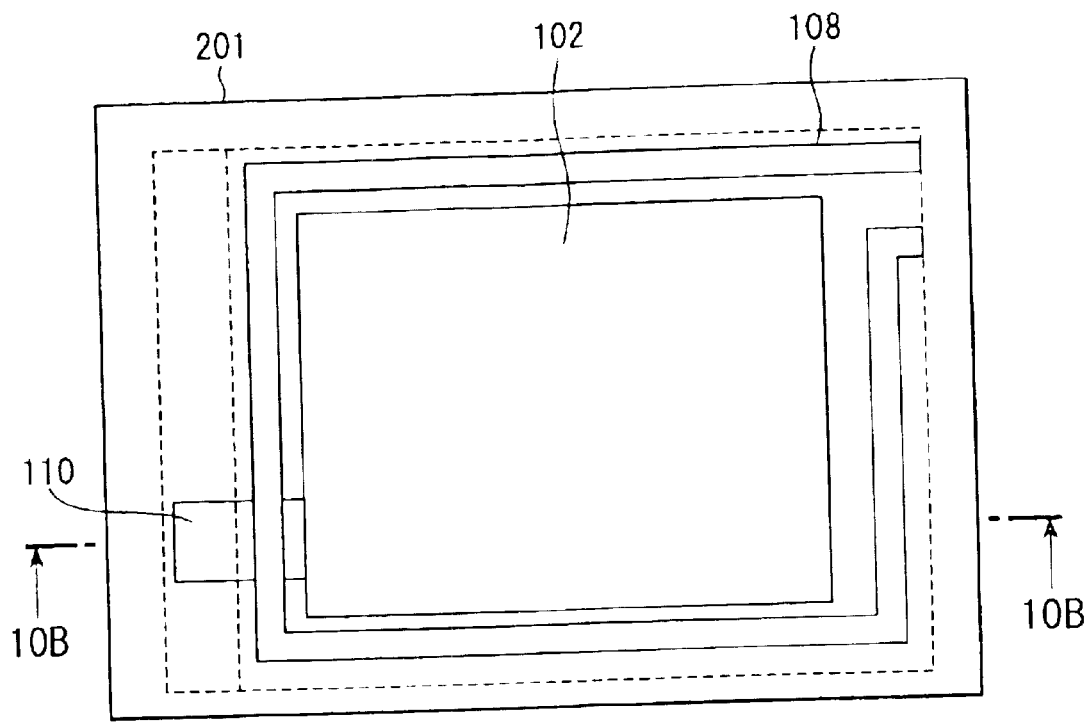
Figure 10B:
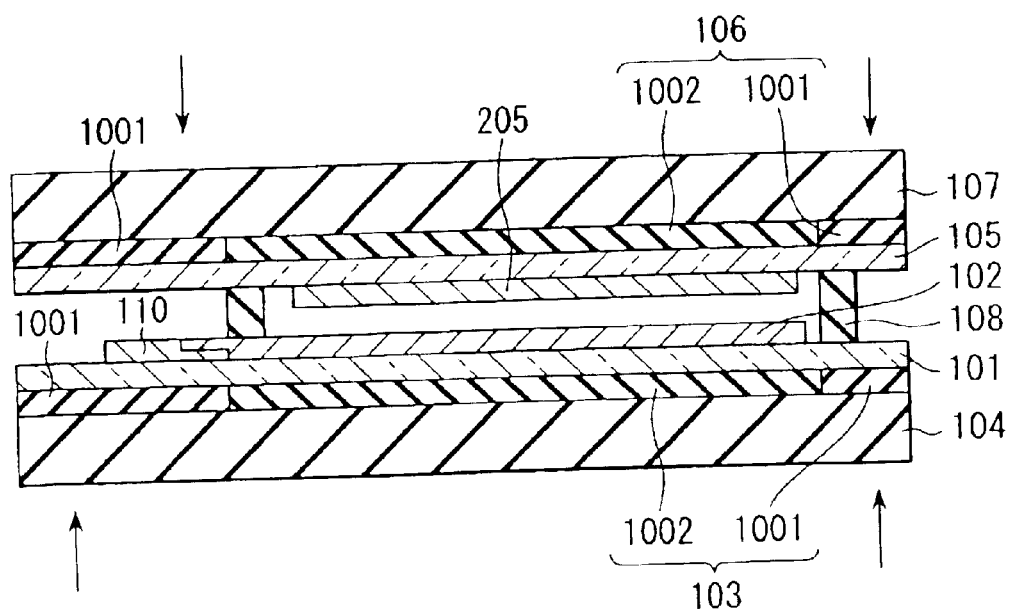
Figure 11A:
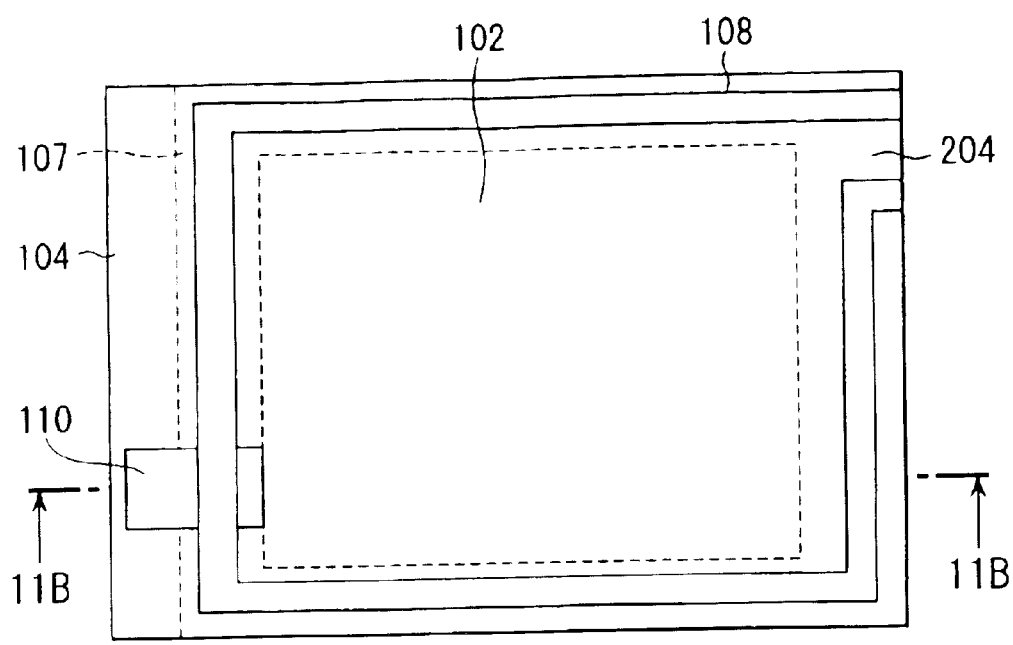
Figure 11B:
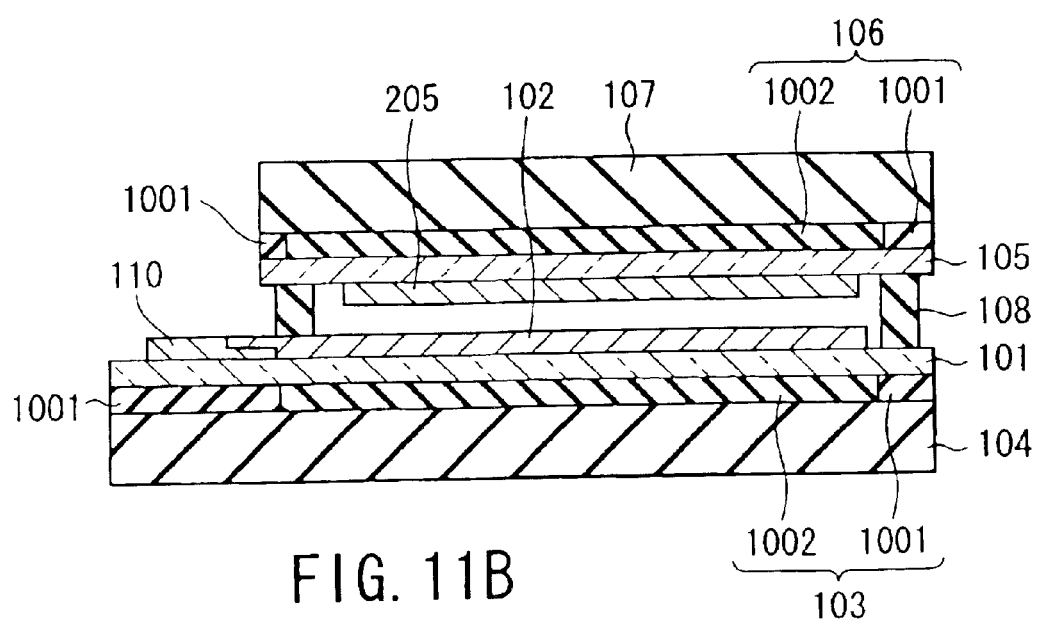

In positions indicated by the dotted lines in FIG. 10A and the arrows in FIG. 10B, a portion from the first thin glass layer 101 to the first plastic substrate 104 and a portion from the second thin glass layer 105 to the second plastic substrate 107 are cut, thereby extracting a portion serving as a display device as shown in FIGS. 11A and 11B. These thin glass layers and plastic layers are simultaneously cut by using a laser. It is also possible to form a number of display devices at once by using large non-alkaline glass substrates and plastic substrates and cutting these display devices in this step. When a $CO_2$ laser or a UV-YAG laser of a secondary, tertiary, or quaternary harmonic component is used, the end faces are smoothly cut, and cracking of the thin glass layers from these end faces can be prevented. If necessary, the end faces can be further polished to form smoother surfaces. Furthermore, the plastic substrates and thin glass layers can be separately cut by selecting respective appropriate laser emission conditions and cutting methods, without being simultaneously cut.

Figure 12A:
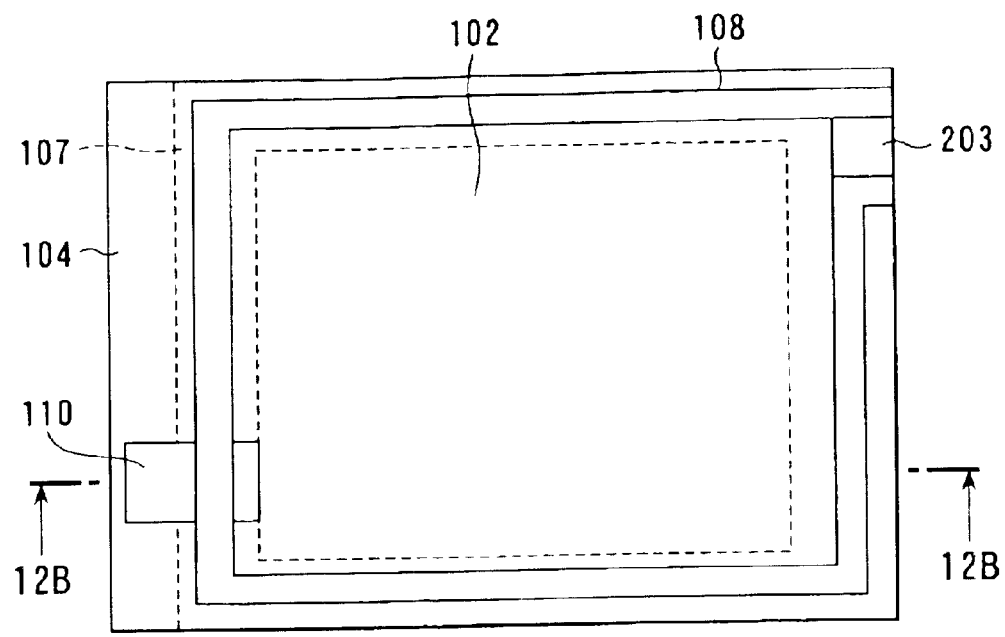
Figure 12B:
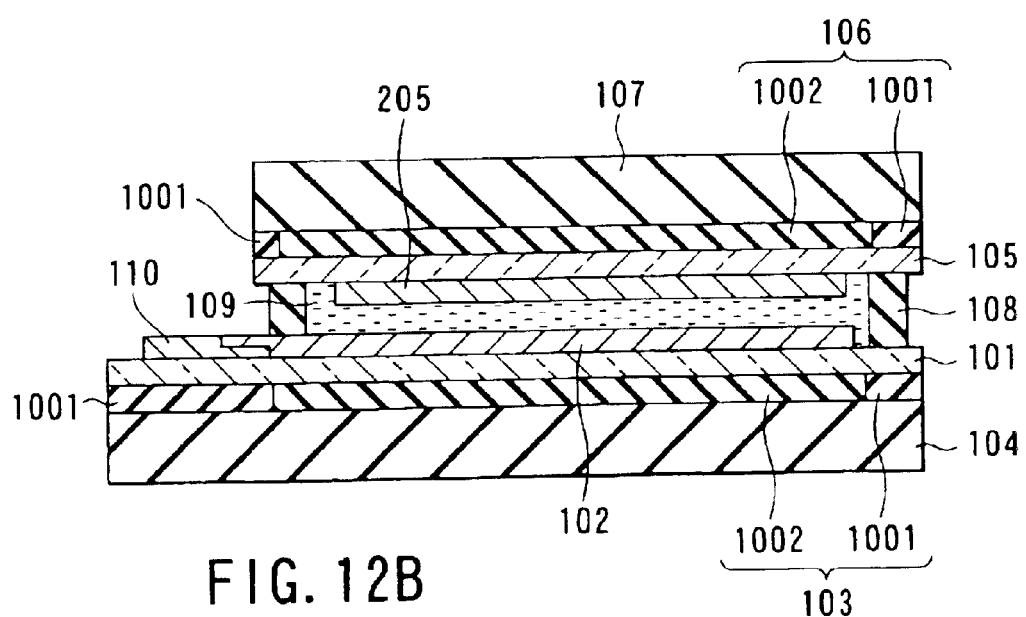

As shown in FIGS. 12A and 12B, a liquid crystal is injected and encapsulated. A cell and liquid crystal reservoir are placed in a vacuum chamber, and the vacuum chamber is evacuated. After the chamber is well evacuated, the injection hole 204 is brought into contact with the liquid crystal reservoir, and a liquid crystal 109 is injected by gradually restoring the atmospheric pressure. Instead of this vacuum injection, suction injection may be performed by forming an injection hole and suction hole. The liquid crystal can be a nematic liquid crystal, cholesteric liquid crystal, ferroelectric liquid crystal, or polymer dispersion liquid crystal. The injection hole 204 is sealed with an ultraviolet ray curable resin 203 or the like to complete the cell.

Figure 13A:
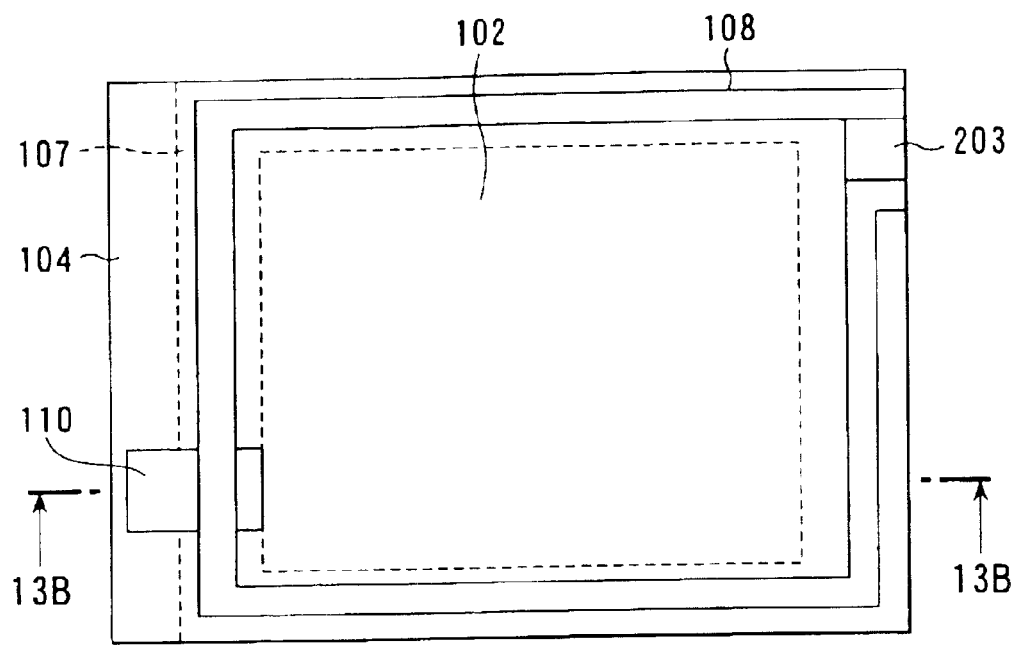
Figure 13B:
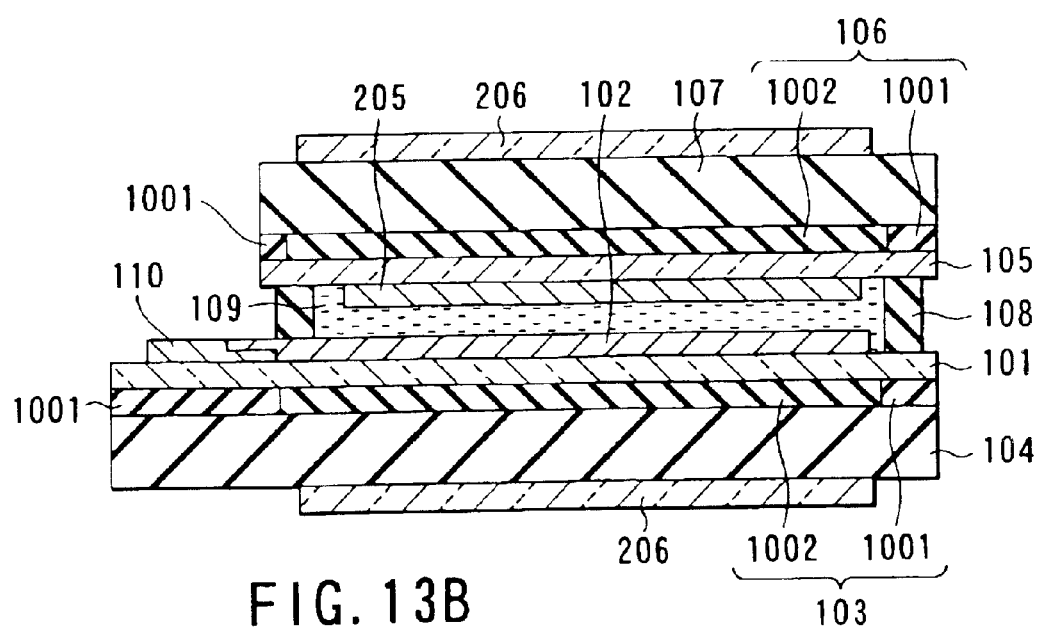

When a TN (Twisted Nematic) liquid crystal is used as the liquid crystal 109 to obtain a transmitting type display device, as shown in FIGS. 13A and 13B, polarizers 206 are formed on the outer surfaces of the first and second plastic substrates 104 and 107. For example, when the second plastic substrate 107 is used as a viewing side, the viewing angle can be increased by adding a retardation film to the polarizer on this side as in the conventional display devices. Also, when a reflecting plate is placed in the liquid crystal cell to use this display device as a reflecting type display device, the polarizer/retardation film 206 can be formed only on the second plastic substrate 107. The polarizer can also be omitted if the liquid crystal is in a scattering, interference display mode.

In this embodiment, the liquid crystal is injected after the cell is formed by bonding the plastic substrates to the thin glass layers. However, the following assembling method is also usable.

First, first and second non-alkaline glass substrates are thinned to form first and second thin glass layers, respectively. After first and second plastic substrates are bonded to these thin glass layers, a sealing portion made of an ultraviolet ray curable adhesive is formed on one glass substrate. A liquid crystal is injected inside this sealing portion, and the sealing portion is covered with the other glass substrate and hardened to bond the two glass substrates. In this method, the injection hole 204 is not formed. FIG. 2A shows this arrangement having no injection hole. Otherwise, when two thick glass substrates are bonded as shown in FIG. 5, liquid crystal may be dropped onto the display portion, and then the two glass substrates are sealed. After the sealing, the two glass substrates are polished to thin, followed by attaching the plastic substrates.

An example of the structure of an element usable in the active matrix type display device of this embodiment will be described with reference to FIGS. 14A and 14B. Although the display device has only two pixels in FIGS. 14A and 14B, a large number of pixels are actually formed in a matrix manner when viewed from the display surface.

Of the structure shown in FIGS. 14A and 14B, a portion different from FIGS. 2A and 2B, i.e., a portion from the first thin glass layer 101 to the second thin glass layer 105 will be explained.

On the first thin glass layer 101, first and second undercoat insulating films 315 and 316 are stacked, and a polysilicon film including an active layer 302 and source/drain regions 303 is formed in each pixel. A gate insulating film 304 is formed on the entire surface. On this gate insulating film 304, gate electrodes 305 are formed in regions corresponding to the active layers 302. On top of these gate electrodes 305, an interlayer dielectric film 306 is formed on the entire surface. On this interlayer dielectric film 306, source electrodes 307 and drain electrodes 308 connecting to the source/drain regions 303 via contact holes are formed.

Interconnections such as scanning/signal lines 320 are formed in the same layer as the source electrodes 307 and drain electrodes 308. Covering these interconnections, a passivation film 321 is formed on the entire surface. On this passivation film 321, color filter layers 309 are formed in regions corresponding to the individual pixels. On these color filter layers 309, pixel electrodes 310 connecting to the drain electrodes 308 via contact holes are formed. The pixel region in which these components are formed is surrounded by the seal 108, and the second thin glass layer 105 is placed on it. The common electrode 205 is formed on that surface of this second thin glass layer 105, which opposes the pixel region. In the space surrounded by the pixel region, common electrode 205, and seal 108, a liquid crystal is injected to form the liquid crystal layer 109.

In a region not participating in display, pillars 311 are formed every few pixels between the color filter layers 309 and common electrode 205. When external stress such as bending is applied, these pillars 311 absorb the force. Although fiber-like pillars or pearl-like pillars can be used, the pillars 311 are not limited to these forms.

In the peripheral region around the pixel region, electrodes 312 are formed in the same layer as the interconnections such as the scanning/signal lines 320, and connected to the common electrode 205 via transfer conductors 313. These transfer conductors 313 are covered with resin protectors 314. Likewise, an anisotropic conductive sheet 319 is formed on the connecting pad electrode 110 which is formed in the same layer as the interconnections such as the scanning/signal lines 320 in the peripheral region. Interconnections 318 formed on the surface of a flexible substrate 317 are connected via this anisotropic conductive sheet 319.

A method of manufacturing the element having the structure as described above will be explained below. First, first and second undercoat insulating films 315 and 316 are formed on a first non-alkaline glass substrate 201. The first undercoat insulating film 315 is formed to have a thickness of about 500 nm by using a silicon nitride film. The second undercoat insulating film 316 is formed to have a thickness of about 100 nm by using a silicon oxide film. These undercoat insulating films can be a single layer, or other materials are also usable. The film thickness is preferably about 100 to 500 nm.

On the second undercoat insulating film 316, an amorphous silicon film which functions as active layers 302 and source/drain regions 303 is formed and patterned as a polysilicon layer after being crystallized by excimer laser annealing. Instead of simple laser emission, it is possible to use a technique by which an intensity profile is formed in laser emission to cause lateral crystal growth and increase the grain size, or a method which causes crystallization by heat without using any laser. In this heat crystallization, crystallization may be performed by using a metal such as Ni. The crystal grain size can be relatively small, e.g., about 0.1 μm to 10 μm, or as large as a single crystal. The grain boundary may be liked like a lattice. The source/drain regions 303 are formed by introducing n- and p-type impurities by ion implantation or mass-separated ion injection. After gate electrodes (to be described later) are formed, it is possible to apply a self-aligned structure using these gate electrodes as masks or apply an LDD (Lightly Doped Drain) structure in which a low-concentration doping region is sandwiched between each of the source/drain region 303 containing a high-concentration impurity and active layer 302.

Subsequently, a silicon oxide film is formed as a gate insulating film 304 on the entire surface by plasma CVD or the like. Furthermore, gate electrodes 305 are formed in the regions corresponding to the active layers 302 by using, e.g., a metal or alloy such as Mo, MoW, MoTa, Al, or Al—Cu, or highly doped silicon.

On these gate electrodes 305, an interlayer dielectric film 306 about 300 nm to 1 μm thick is formed using a silicon oxide film or the like. As this interlayer dielectric film 306, an organic resin such as polyimide can be used.

Source electrodes 307 and drain electrodes 308 connecting to the source/drain regions 302 via through-holes formed in the gate insulating film 304 and interlayer dielectric film 306 are formed on the interlayer dielectric film 306 by using, e.g., a metal or alloy such as Mo, MoW, MoTa, Al, or Al—Cu, or highly doped silicon.

In the same layer as the source electrodes 307 and drain electrodes 308, an electrode 312 which applies a potential to a connecting pad electrode 110, inter-connections such as scanning/signal lines 320, and a common electrode 205 is formed using the same conductor material as described above.

On these electrodes and interconnections, a passivation film 321 is formed by plasma CVD or the like by using, e.g., a silicon nitride film. On this passivation film 321, a transparent organic insulating film about 1 μm to 4 μm thick may be formed by substantially the same pattern as the passivation film 321, in order to improve the insulating properties and reduce the parasitic capacitance between the interconnections.

On the passivation film 321, color filter layers 309 made of a photosensitive organic resin are formed for individual pixels, thereby forming a color filter on array (COA) structure.

Pixel electrodes 310 are formed on the color filter layers 309. These pixel electrodes 310 are connected to the drain electrodes 308 via through-holes formed in the color filter layers 309 and passivation film 321. When the COA structure is formed or the display device is a transmitting type display device, a transparent conductive film such as ITO can be used as the pixel electrodes 310. When the display device is a reflecting type display device, a high-reflectivity metal such as Al or Ag can be used.

Since the surface on which the pixel electrodes 310 are formed is brought into contact with a liquid crystal, an alignment film (not shown) is formed and subjected to rubbing. An alignment film (not shown) is also formed on the surface of the common electrode 205 made of a transparent conductive film such as ITO on a second non-alkaline glass substrate 202, and subjected to rubbing. Depending on the display mode, the common electrode 205 may be unnecessary, or the rubbing process using an alignment film may be unnecessary. Also, the color filter structure need not be the COA structure. For example, color filter layers may be formed between the second non-alkaline glass substrate 202 and common electrode 205, or overcoat layers may be formed on the color filter layers.

Not only the above-mentioned element structures are formed in the prospective pixel region but also transistors of control circuits such as a signal line driver and scanning line driver can be integrated with the pixel region. In this case, the control circuits are also bonded by the pixel region adhesion layer 1002 having a low glass transition temperature.

On the connecting pad electrode 110 formed in the peripheral region, a flexible substrate 317 is placed via an anisotropic conductive film (ACF) and electrically connected by thermal compression bonding or thermal cure. This flexible substrate 317 is made of polyimide or PET, and an interconnection 318 made of a metal such as copper is formed. In this embodiment, a material having a high glass transition temperature is used as the peripheral region adhesion layer 1001. Therefore, cracking does not easily occur even when thermal compression bonding is performed. This connection can also be formed by a mechanical connecting method or wire bonding, instead of thermal compression bonding.

The electrode 312 which applies a potential to the common electrode 205 is connected to the common electrode 205 via transfer conductors 313 made of, e.g., conductive paste when the cell is formed. Resin protectors 314 are formed around these transfer conductors 313 to reinforce the connection between the common electrode 305 and electrode 312, thereby preventing poor connections if the display device is bent when in use. As this resin protector 314, an acryl-, epoxy-, or allyl-based ultraviolet ray curable resin is used. The first and second non-alkaline glass substrates may be thinned and bonded to the first and second plastic substrates after the cell is formed and a liquid crystal is injected. In this case, reinforcement of the connection by the resin protectors 314 is more important. These resin protectors 314 can be formed not only around the transfer conductors 313 but also around the connecting pad electrode 110.

In the active matrix type display device of this embodiment, after an element circuit region is formed on a substrate such as a non-alkaline glass substrate which is highly resistant against heat, this substrate is thinned and bonded to a plastic substrate which is light in weight. The glass transition temperature of a pixel region adhesion layer is 30° C. (inclusive) to 80° C. (inclusive), and the glass transition temperature of a peripheral region adhesion layer is higher by 10° C. or more than that of the pixel region adhesion layer, and is 80° C. (exclusive) to 200° C. (inclusive). The pixel region adhesion layer is a soft adhesive because its glass transition temperature is low. Therefore, when the plastic substrate contracts or expands because the display device is bent, the force of this contraction or expansion can be absorbed without being transmitted directly to the thin glass layer.

If the glass transition temperature of the pixel region adhesion layer is lower than 30° C., the temperature of the display device is always equal to or higher than this glass transition temperature when the device is used at a room temperature, so no adhesion may be obtained. On the other hand, a glass transition temperature of higher than 80° C. is too high, so the adhesion layer becomes hard.

Also, the peripheral region adhesion layer is a hard adhesive because its glass transition temperature is high. Therefore, the outermost region of the thin glass layer which easily cracks can be strongly bonded. In addition, bonding to a flexible substrate for obtaining electrical connection to the pixel region is performed in the peripheral region by thermal compression bonding or the like. In this bonding, the hard peripheral region adhesion layer suppresses contraction and expansion of the plastic substrate by heat, and also suppresses cracking of the thin glass layer by the pressure or the like during bonding.

If the glass transition temperature of this peripheral region adhesion layer is about 80° C. or less, the adhesion layer may become a soft adhesion layer depending on the use conditions. On the other hand, a glass transition temperature of higher than 200° C. is too high, so the plastic substrate may deform when it is bonded. By setting the difference between the glass transition temperatures of the pixel region adhesion layer and peripheral region adhesion layer to be 10° C. or more, it is possible to maintain the hardness of the peripheral region adhesion layer 1001 at higher temperatures, and protect the edges of the readily breakable thin glass layer 105 against cracking.

Figure 15:
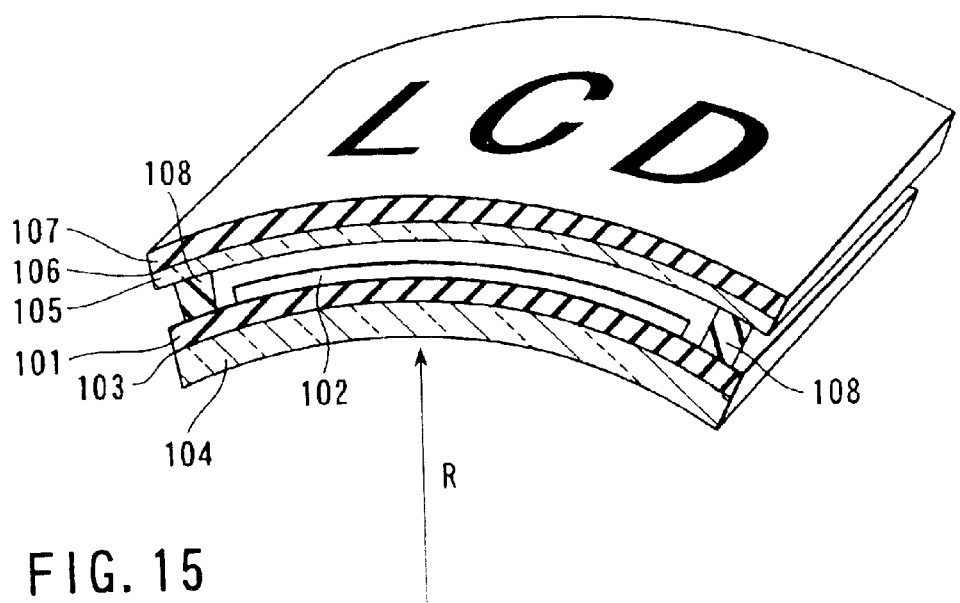
FIG. 15 is a schematic view for explaining the flexibility of an active matrix type display device of the present invention.

Accordingly, as shown in FIG. 15, even when this display device is bent to form a curved surface having a radius R of curvature of about 50 mm to 150 mm, no cracks are formed in either the pixel region or peripheral region. The weight can be reduced because the thickness of the plastic substrate and thin glass layer having the adhesion layer sandwiched between them is about 0.1 mm. Since the thin glass layer exists, the active element circuit region is damaged little, and permeation of water and gas such as oxygen can be prevented, so good element characteristics can be obtained.

Also, when the display device is bent, tensile stress is produced on the convex surface, and compression stress is produced on the concave surface, so a plane having zero stress is formed between the two surfaces. In this embodiment, the first and second thin glass layers are formed between the first and second plastic substrates. Therefore, the zero stress plane can be formed substantially between the first thin glass layer and second thin glass layer. This improves the bending strength of the display.

In the above embodiment, an active matrix in which one pixel is made up of one switching transistor, pixel electrode, and capacitive element is explained. However, the present invention is also applicable to a display device which reduces the power consumption by using a memory circuit (flip-flop; SRAM type, storage capacitor and driver transistor: DRAM type) for each pixel.

Furthermore, a control circuit, CPU, memory, and the like may be integrated in addition to the scanning line and signal line drivers. These circuits, display electrodes, and the like can be collectively regarded as the components of the active element circuit region 102. Although these circuits inevitably require micropatterning, the use of the non-alkaline glass substrate which deforms little and has high processing accuracy allows formation of high-performance highly integrated circuits.

(Second Embodiment)

Figure 16A:
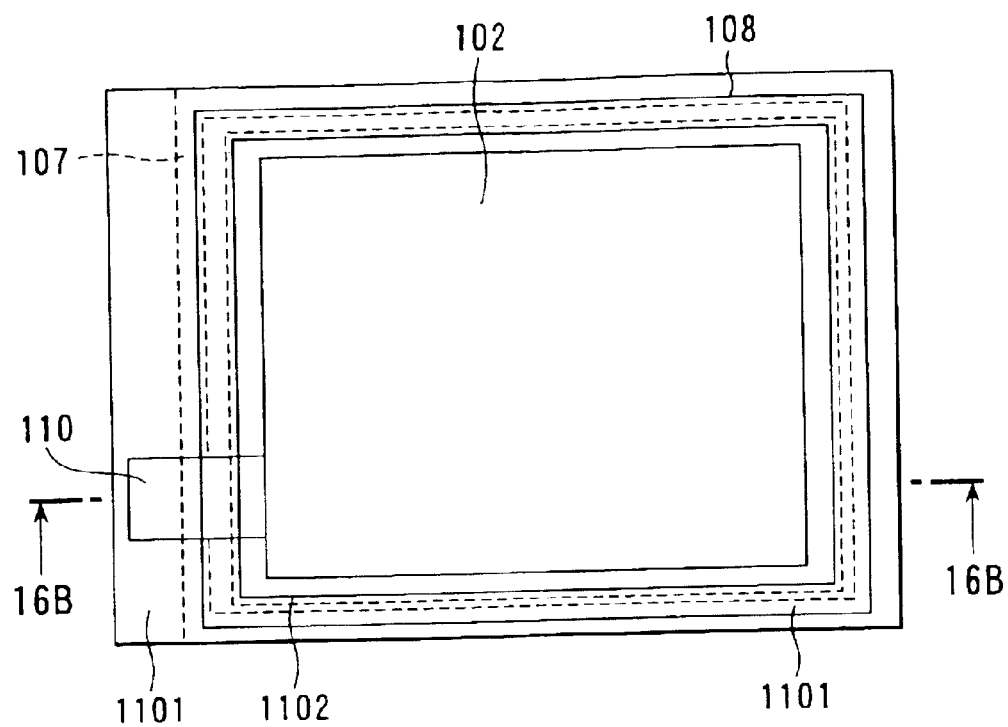
FIG. 16A is a plan view of an active matrix type display device according to the second embodiment.
Figure 16B:
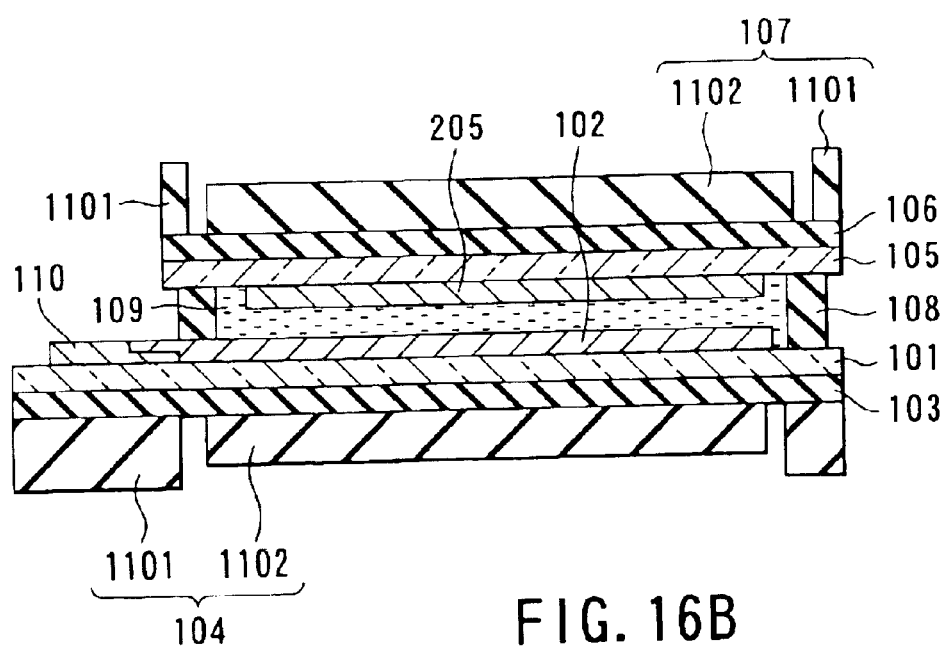
FIG. 16B is a sectional view taken along a line 16B—16B in FIG. 16A.

FIG. 16A is a plan view of an active matrix type display device according to the second embodiment. FIG. 16B is a sectional view taken along a line 16B—16B in FIG. 16A. In this second embodiment, only a difference from the first embodiment will be explained, and a description of similar parts will be omitted. This applies to each embodiment to be described later.

In the active matrix type display device of this embodiment, an adhesion layer is uniformly formed from one type of material. The difference from the first embodiment is that each of first and second plastic substrates 104 and 107 is separated into a pixel region plastic substrate 1102 and a peripheral region plastic substrate 1101 formed around the pixel region plastic substrate 1102. The linear expansion coefficient of the pixel region plastic substrate 1102 is 30 ppm/° C. (inclusive) to 300 ppm/° C. (inclusive). The linear expansion coefficient of the peripheral region plastic substrate 1101 is 1 ppm/° C. (inclusive) to 30 ppm/° C. (inclusive), which is about ⅔ or less that of the pixel region plastic substrate 1102.

Between the pixel region plastic substrate 1102 and the peripheral region plastic substrate 1101 around the pixel region plastic substrate 1102, a slight spacing is desirably formed as a margin against extension.

The pixel region plastic substrate 1102 can be made of, e.g., PES, polycarbonate, polyolefin-based resin (e.g., Zeonor, cycloolefin polymer, produced by Zeon Corporation), acrylic resin, polypropylene, polyester, or polyethylene, and can have a thickness of about 10 μm to 200 μm. The peripheral region plastic substrate 1101 can be made of, e.g., PEN (PolyEthylene Naphthalate), polyethyleneterephthalate (PET), polyimide, filler-mixed epoxy resin, polyetheretherketone (PEEK), polysulfone (PSF), or polyetherimide (PEI), and can have a thickness of about 50 μm to 200 μm.

Even when a material having a large linear expansion coefficient is used, this linear expansion coefficient can be decreased by mixing fillers such as silica or alumina, so the material can be used as the peripheral region plastic substrate 1101. This peripheral region plastic substrate 1101 can be an opaque substrate because it does not participate in display.

The pixel region plastic substrate 1102 and peripheral region plastic substrate 1101 can have the same thickness, or the peripheral region plastic substrate 1101 can be thicker. When the peripheral region plastic substrate 1101 is made thicker, the peripheral region becomes hard to bend. This prevents stress concentration to a thin glass layer 105 in this peripheral region and thus effectively makes this thin glass layer 105 difficult to break.

In this embodiment, a PES film having a linear expansion coefficient of about 46 ppm/° C. is used as the pixel region plastic substrate 1102, and a PEN film having a linear expansion coefficient of about 11 ppm/° C. is used as the peripheral region plastic substrate 1101.

In this embodiment, after an element circuit region is formed on substrates such as non-alkaline glass substrates which are highly resistant against heat, these substrates are thinned and bonded to plastic substrates which are light in weight. The linear expansion coefficient of the pixel region plastic substrate is made as large as about 30 ppm/° C. (inclusive) to 300 ppm/° C. (inclusive). The linear expansion coefficient of the peripheral region plastic substrate is made as small as 1 ppm/° C. (inclusive) to 30 ppm/° C. (exclusive), which is ⅔ or less that of the pixel region plastic substrate.

If the linear expansion coefficient of the pixel region plastic substrate is less than 30 ppm/° C., this linear expansion coefficient is too small, so the display device cannot be flexibly bent. If this linear expansion coefficient is more than 300 ppm/° C., the difference from the linear expansion coefficient of the thin glass layer becomes too large. This applies stress to the thin glass layer when the temperature changes.

If the linear expansion coefficient of the peripheral region plastic substrate is less than 1 ppm/° C., stress acting on the thin glass layer cannot be reduced, so not only this thin glass layer but also the peripheral region plastic substrate may break. If this linear expansion coefficient is more than 30 ppm/° C., the difference from the linear expansion coefficient of the thin glass layer becomes too large. This allows easy cracking when heat is abruptly applied upon adhesion of a connecting pad electrode and the like. Note that the above effects can be obtained by setting the linear expansion coefficient of the peripheral region plastic substrate to be about ⅔ or less that of the pixel region plastic substrate.

Although the pixel region plastic substrate must be transparent, the properties of organic resin make it difficult to obtain a plastic substrate having a small linear expansion coefficient such as that of inorganic glass. Hence, a plastic substrate having a large linear expansion coefficient as described above is used.

Since the linear expansion coefficient of the peripheral region plastic substrate is small, about ⅔ or less that of the pixel region plastic substrate, the linear expansion coefficients of the plastic substrate and thin glass layer are close in this peripheral region. Accordingly, the degree of expansion and contraction of this peripheral region plastic substrate when the temperature changes while the display device is in use approaches that of the thin glass layer, so no stress is applied to the thin glass layer. This raises the strength of the display device. Also, the peripheral region does not easily expand or contract even when temporarily heated and bonded by thermal compression bonding to a connecting pad electrode 110 formed in this peripheral region.

(Third Embodiment)

Figure 17A:
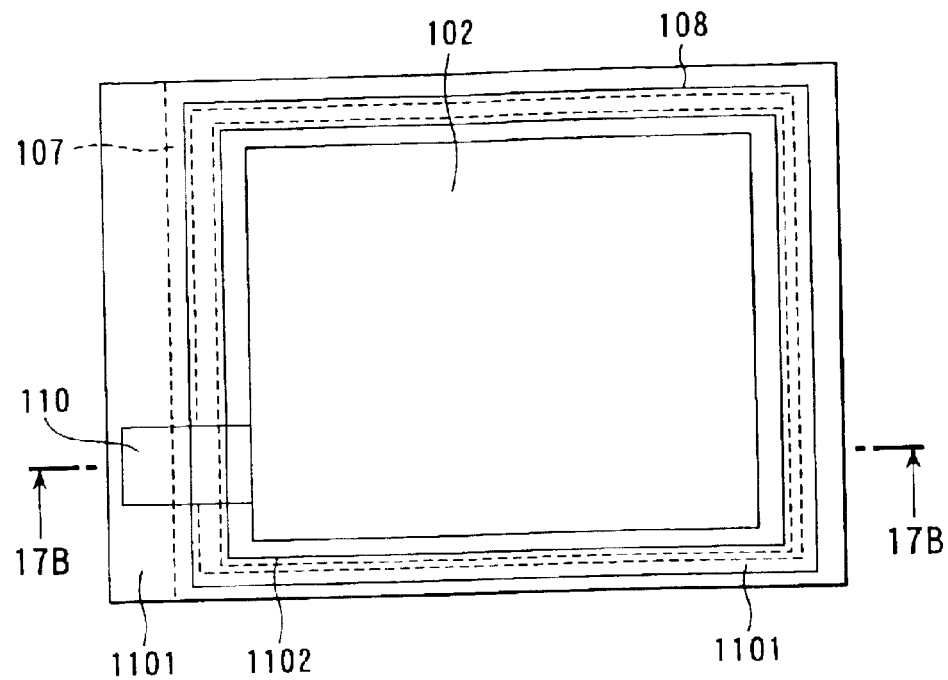
FIG. 17A is a plan view of an active matrix type display device according to the third embodiment.
Figure 17B:
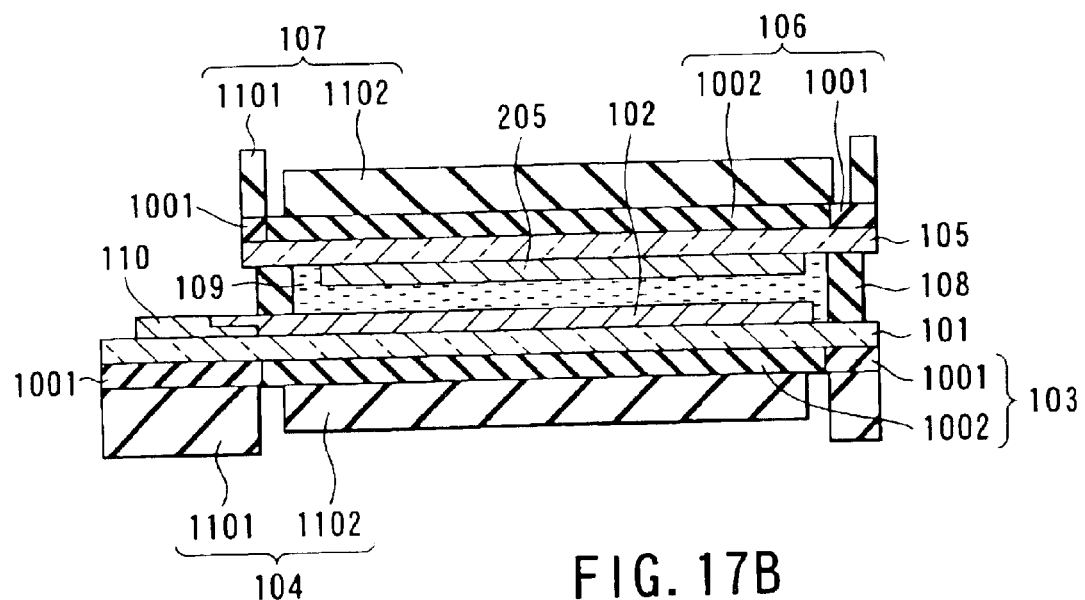
FIG. 17B is a sectional view taken along a line 17B—17B in FIG. 17A.

An active matrix type display device of the third embodiment has the characteristic features of both the first and second embodiments. That is, as shown in FIGS. 17A and 17B, an adhesion layer between a plastic substrate and thin glass layer is separated into a pixel region adhesion layer 1002 and peripheral region adhesion layer 1001. In addition, the glass transition temperature of the pixel region adhesion layer 1002 is 30° C. (inclusive) to 80° C. (inclusive), and the glass transition temperature of the peripheral region adhesion layer 1001 is higher by 10° C. or more than that of the pixel region adhesion layer 1002, and is 80° C. (exclusive) to 200° C. (inclusive).

Also, a plastic substrate is separated into a pixel region plastic substrate 1102 and a peripheral region plastic substrate 1101 formed around the pixel region plastic substrate 1102. The linear expansion coefficient of the pixel region plastic substrate 1102 is 30 ppm/° C. (inclusive) to 300 ppm/° C. (inclusive) The linear expansion coefficient of the peripheral region plastic substrate 1101 is about 1 ppm/° C. (inclusive) to 30 ppm/° C. (exclusive), which is about ⅔ or less that of the pixel region plastic substrate 1102. Furthermore, a slight spacing is formed between the pixel region plastic substrate 1102 and the peripheral region plastic substrate 1101.

With this construction, the effects of both the first and second embodiments can be obtained. In addition, the materials and characteristics of both the adhesion layer and plastic substrate can be selected in the pixel region and peripheral region independently of each other. This can maintain the element characteristics more preferably and maintain the strength of the thin glass layer.

(Fourth Embodiment)

Figure 18:
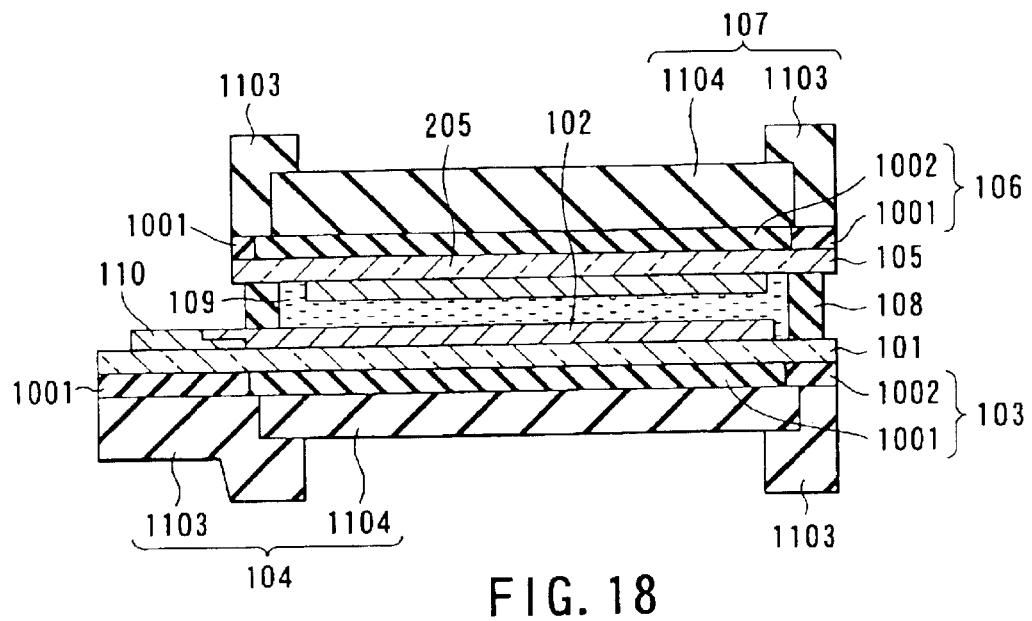
FIG. 18 is a sectional view of an active matrix type display device according to the fourth embodiment.

An active matrix type display device of the fourth embodiment is a modification of the second embodiment. As shown in FIG. 18, a portion of a peripheral region plastic substrate 1103 covers a pixel region plastic substrate 1104 to form an overlapping portion.

More specifically, the linear expansion coefficient of the pixel region plastic substrate is 30 ppm/° C. (inclusive) to 300 ppm/° C. (inclusive), and the linear expansion coefficient of the peripheral region plastic substrate is about 1 ppm/° C. (inclusive) to 30 ppm/° C. (exclusive), which is about ⅔ or less that of the pixel region plastic substrate.

Even in this embodiment, the effects of the second embodiment can be obtained. Also, the whole of a thin glass layer can be reinforced because there is no spacing between the pixel region plastic substrate 1104 and peripheral region plastic substrate 1103.

(Fifth Embodiment)

Figure 19:
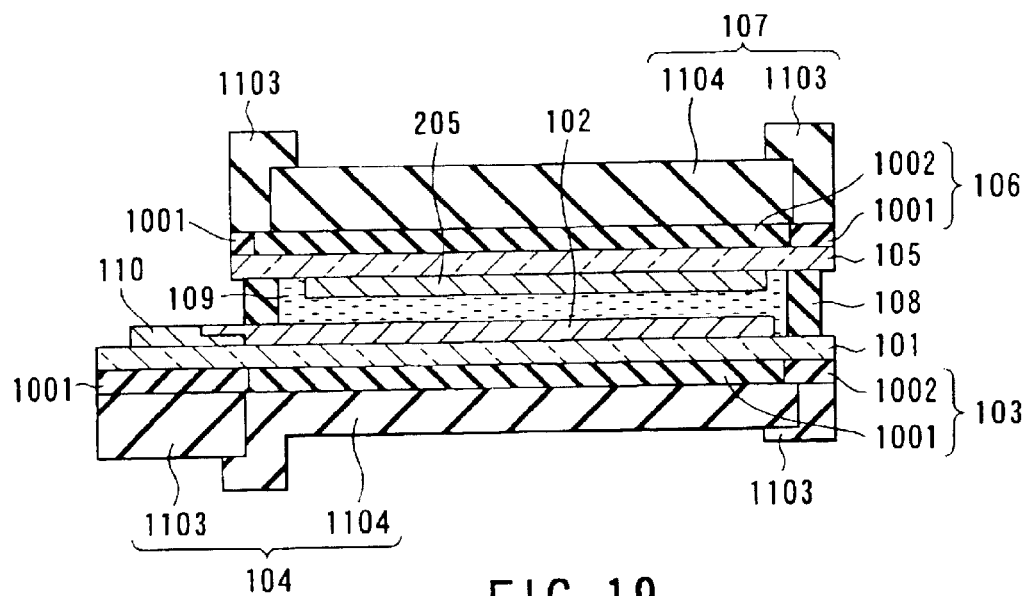
FIG. 19 is a sectional view of an active matrix type display device according to the fifth embodiment.

An active matrix display device of the fifth embodiment shown in FIG. 19 has the characteristic features of both the first and fourth embodiments. That is, an adhesion layer between a plastic substrate and thin glass layer is separated into a pixel region adhesion layer 1102 having a glass transition temperature of 30° C. (inclusive) to 80° C. (inclusive), and a peripheral region adhesion layer 1101 having a glass transition temperature which is higher by 10° C. or more than that of the pixel region adhesion layer and is 80° C. (exclusive) to 200° C. (inclusive)

Also, the plastic substrate is separated into a pixel region plastic substrate 1104 having a linear expansion coefficient of 30 ppm/° C. (inclusive) to 300 ppm/° C. (inclusive), and a peripheral region plastic substrate 1103 formed around the pixel region plastic substrate 1104 and having a linear expansion coefficient of 1 ppm/° C. (inclusive) to 30 ppm/° C. (exclusive) which is about ⅔ or less that of the pixel region plastic substrate. A portion of the peripheral region plastic substrate 1103 covers the pixel region plastic substrate 1104 to form an overlapping portion.

With this construction, the effects of both the first and fourth embodiments can be obtained. Furthermore, the materials and characteristics of both the adhesion layer and plastic substrate can be selected in the pixel region and peripheral region independently of each other. This can maintain the element characteristics more preferably and maintain the strength of the thin glass layer.

(Sixth Embodiment)

Figure 20A:
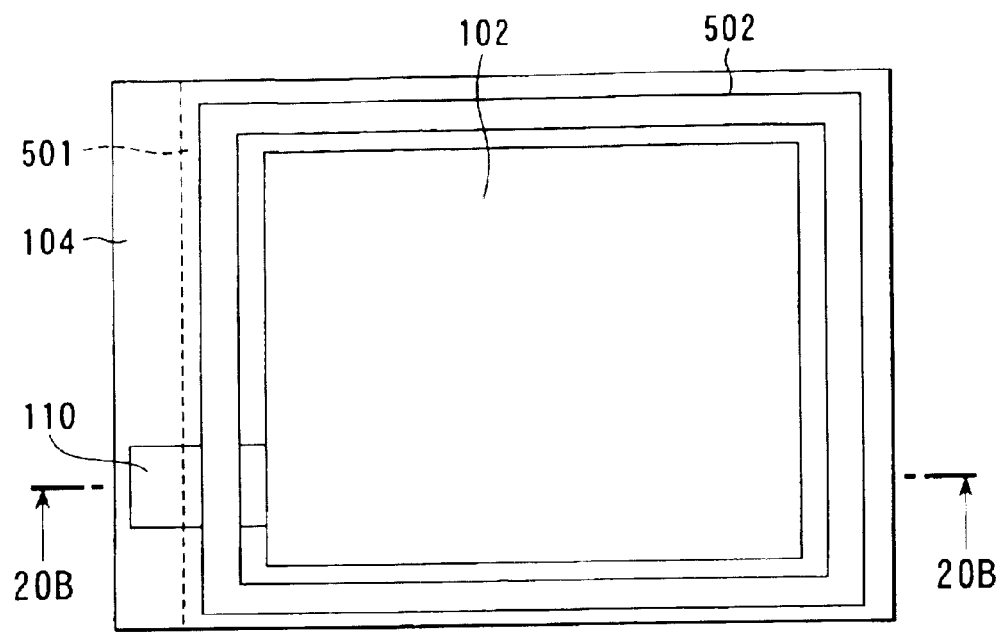
FIG. 20A is a plan view of an active matrix type display device according to the sixth embodiment.
Figure 20B:
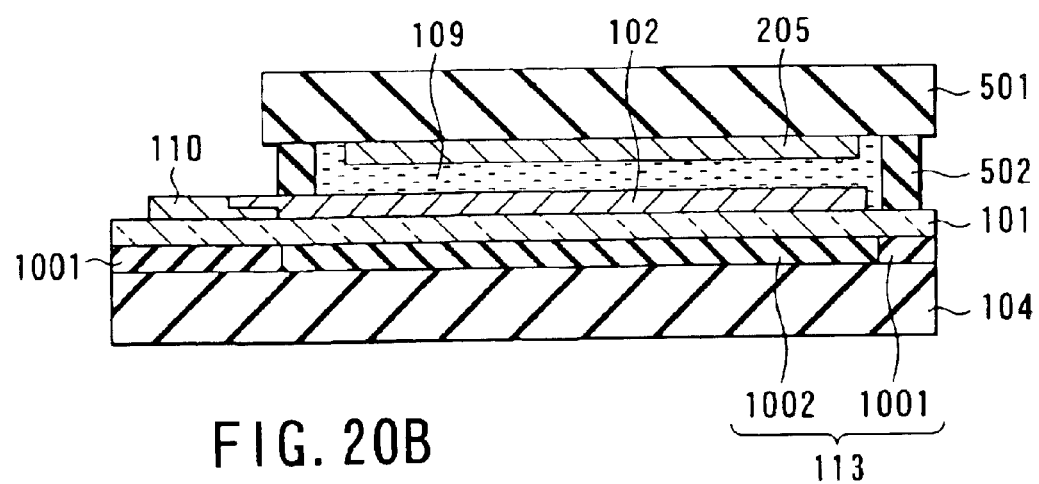
FIG. 20B is a sectional view taken along a line 20B—20B in FIG. 20A.

As shown in FIGS. 20A and 20B, an active matrix type display device of the sixth embodiment differs from the first embodiment in that a substrate on which a common electrode 205 is formed comprises only a plastic substrate 501 with no thin glass layer. This configuration can reduce the number of manufacturing steps and can also reduce readily breakable regions, in addition to the effects of the first embodiment.

A method of manufacturing the active matrix type display device of this embodiment will be explained below with reference to FIGS. 21 to 29A and 29B.

Figure 21:
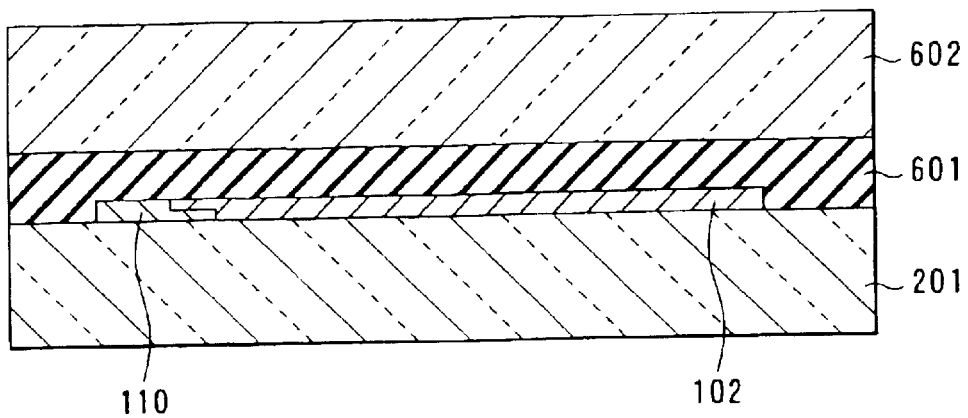
FIGS. 21 to 23 are sectional views showing the manufacturing steps of the active matrix type display device according to the sixth embodiment step by step.

As in the first embodiment, an element circuit region 102 and connecting pad electrode 110 are formed on a first non-alkaline glass substrate 201. After that, as shown in FIG. 21, this first non-alkaline glass substrate 201 having the element circuit region 102 and connecting pad electrode 110 formed on it is bonded to an intermediate substrate 602 made of, e.g., glass or plastic, via a temporary adhesion layer 601. As this temporary adhesion layer 601, it is possible to use, e.g., a water-soluble photo-setting adhesive, or wax or a hot-melt adhesive which softens when heated or cooled. The temporary adhesion layer 601 may be a pressure-sensitive adhesive or a film base having two surfaces coated with a pressure-sensitive adhesive. It is also possible to use a PET film or the like as the intermediate substrate 602, and a self-adhesive tape coated with a pressure-sensitive adhesive as the temporary adhesion layer 601. As the intermediate substrate 602, the same material and thickness as in the first embodiment can be used. In this embodiment, a glass substrate is used as the intermediate substrate 602, and an ultraviolet ray curable, pressure-sensitive adhesive is used as the temporary adhesion layer 601.

Figure 22:
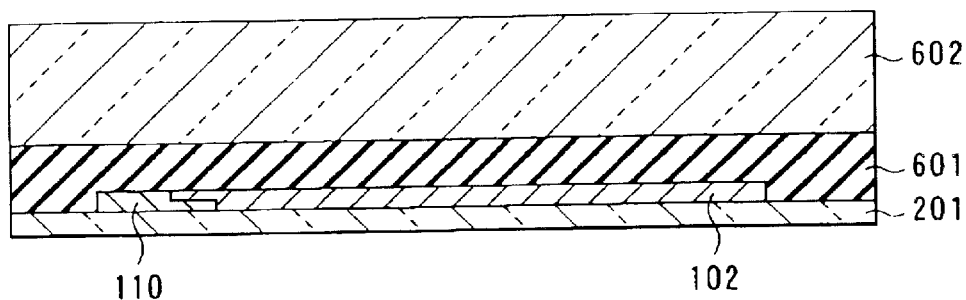

As shown in FIG. 22, the first non-alkaline glass substrate 201 is polished by, e.g., mechanical polishing, chemical polishing, or chemical mechanical polishing, thereby forming a first thin glass layer 101. The film thickness of this first thin glass layer 101 is favorably about 5 $\mu$m to 30 $\mu$m.

Figure 23:
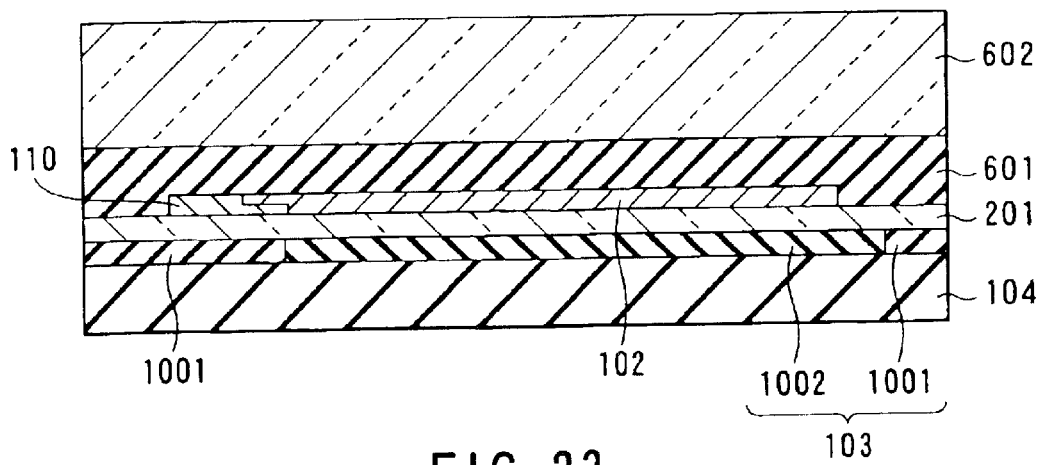

As shown in FIG. 23, the first thin glass layer 101 is bonded to a first plastic substrate 104 via a first adhesion layer 103. In this first adhesion layer 103, the characteristics of a peripheral region adhesion layer 1001 outside a seal 108 are different from those of a pixel region adhesion layer 1002. As in the first embodiment, the glass transition temperature of the pixel region adhesion layer 1002 is 30° C. (inclusive) to 80° C. (inclusive), and the glass transition temperature of the peripheral region adhesion layer 1001 is higher by 10° C. ore more than that of the pixel region adhesion layer 1002, and is about 80° C. (exclusive) to 200° C. (inclusive).

Figure 24A:
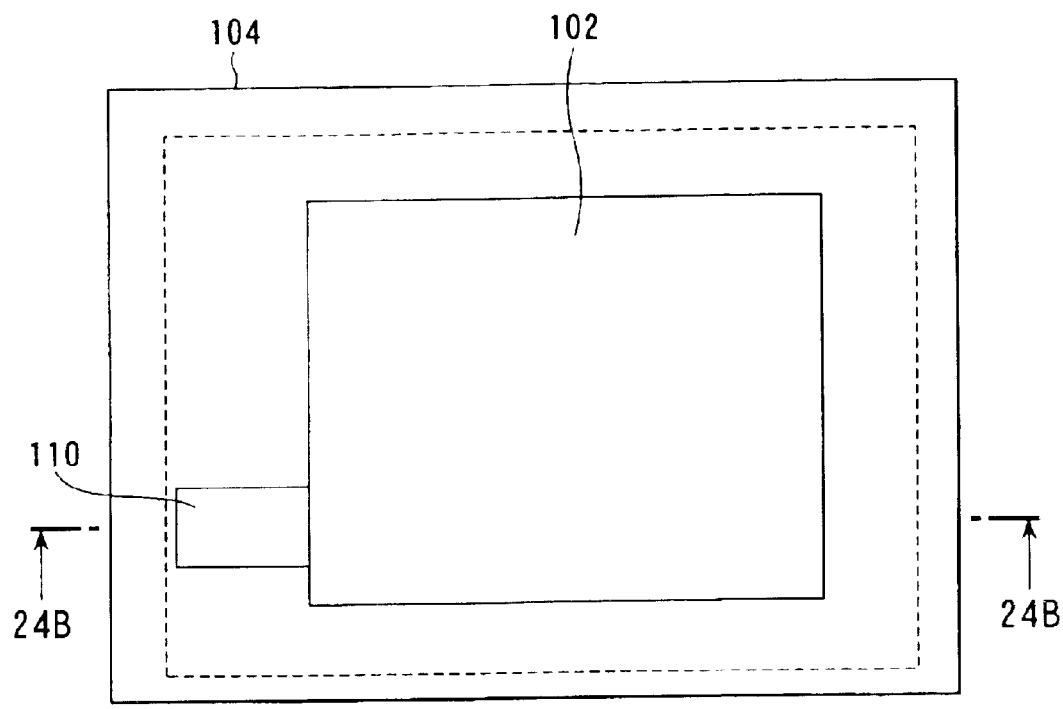
FIGS. 24A to 29B are views showing the manufacturing steps of the active matrix type display device according to the sixth embodiment step by step, in which views having suffix A are plan views, and views having suffix B are sectional views taken along lines designated by numbers suffixed with B in the corresponding plan views.
Figure 24B:
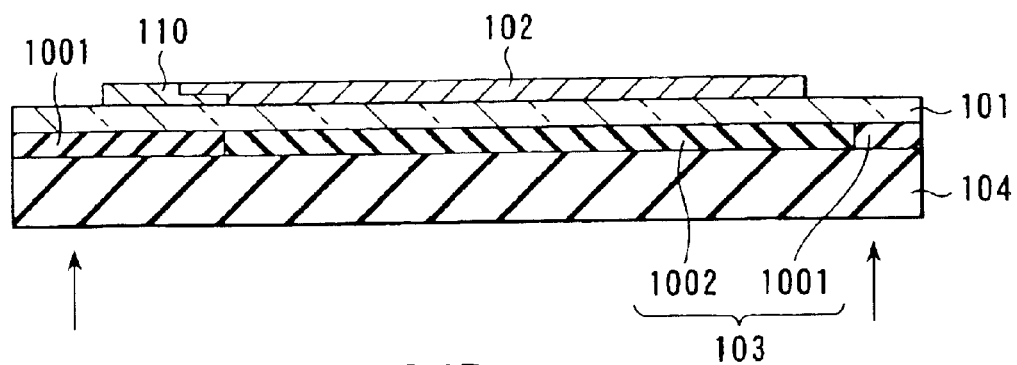

As shown in FIGS. 24A and 24B, ultraviolet rays are radiated from the intermediate substrate side to lower the adhesion properties of the temporary adhesion layer 601, thereby removing this temporary adhesion layer 601. The result is a structure including the first plastic substrate 104, the first adhesion layer 103 (made up of the peripheral region adhesion layer 1001 and pixel region adhesion layer 1002) on the first plastic substrate 104, the first thin glass layer 101 on the first adhesion layer 103, the active element circuit region 102 on the first thin glass layer 101, and the connecting pad electrode 110 on the first thin glass layer 101.

Figure 25A:
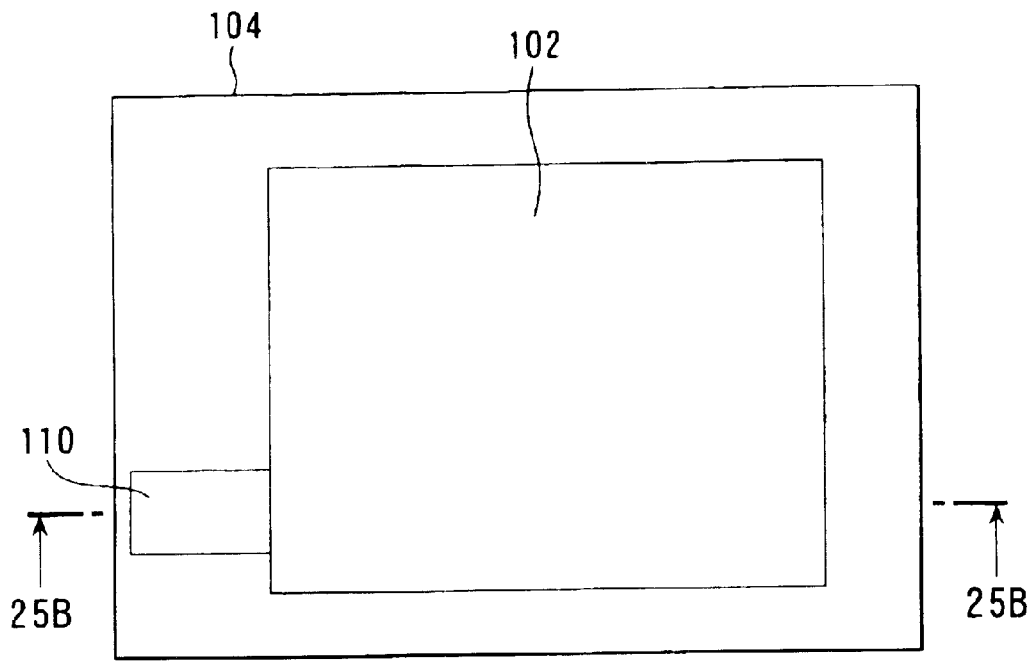
Figure 25B:
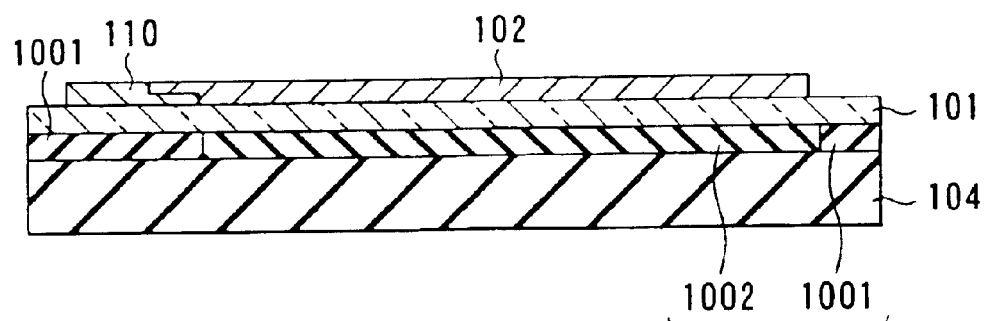

Subsequently, in positions indicated by the dotted lines in FIG. 24A and the arrows in FIG. 24B, a portion from the first thin glass layer 101 to the first plastic substrate 104 is cut to extract a portion serving as a display device as shown in FIGS. 25A and 25B.

Figure 26A:
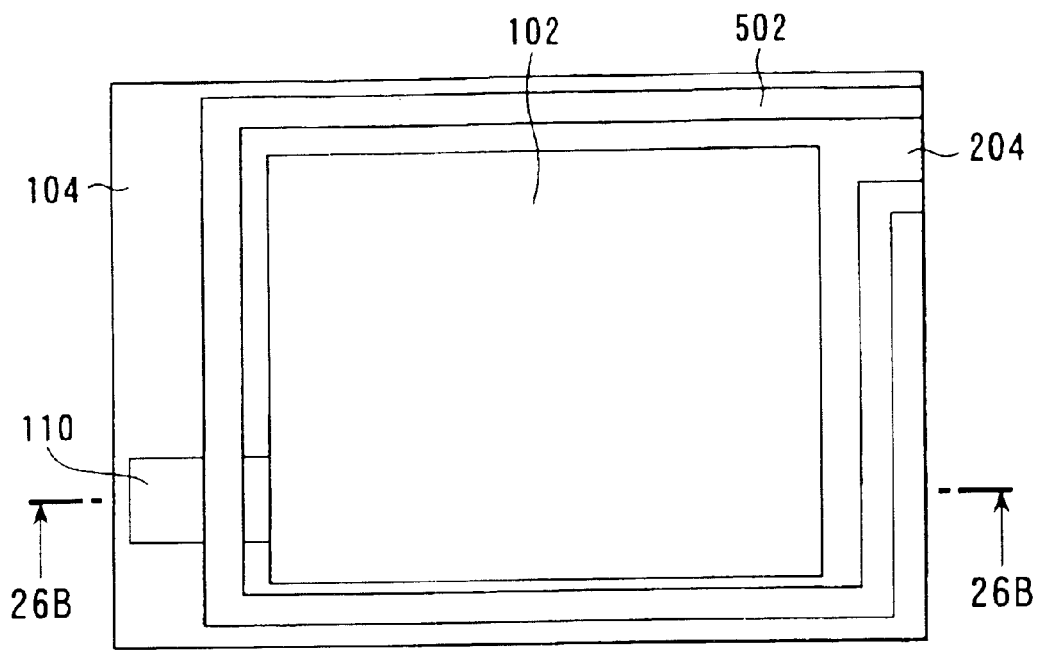
Figure 26B:
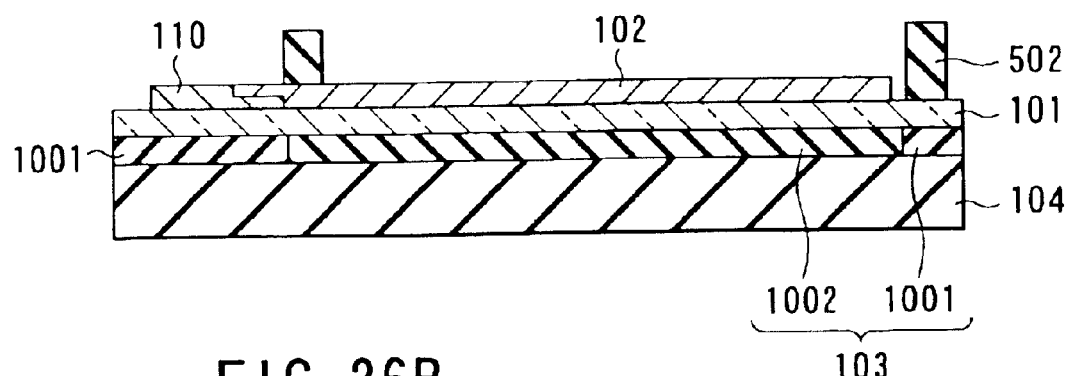

As shown in FIGS. 26A and 26B, a seal 502 is applied by a dispenser or the like so as to surround a region in which pixels are present. At the same time, a liquid crystal injection hole 204 is formed. The seal 502 can be, e.g., an ultraviolet ray curable adhesive or thermosetting adhesive, and is preferably a material which hardens at low temperatures.

Figure 27A:
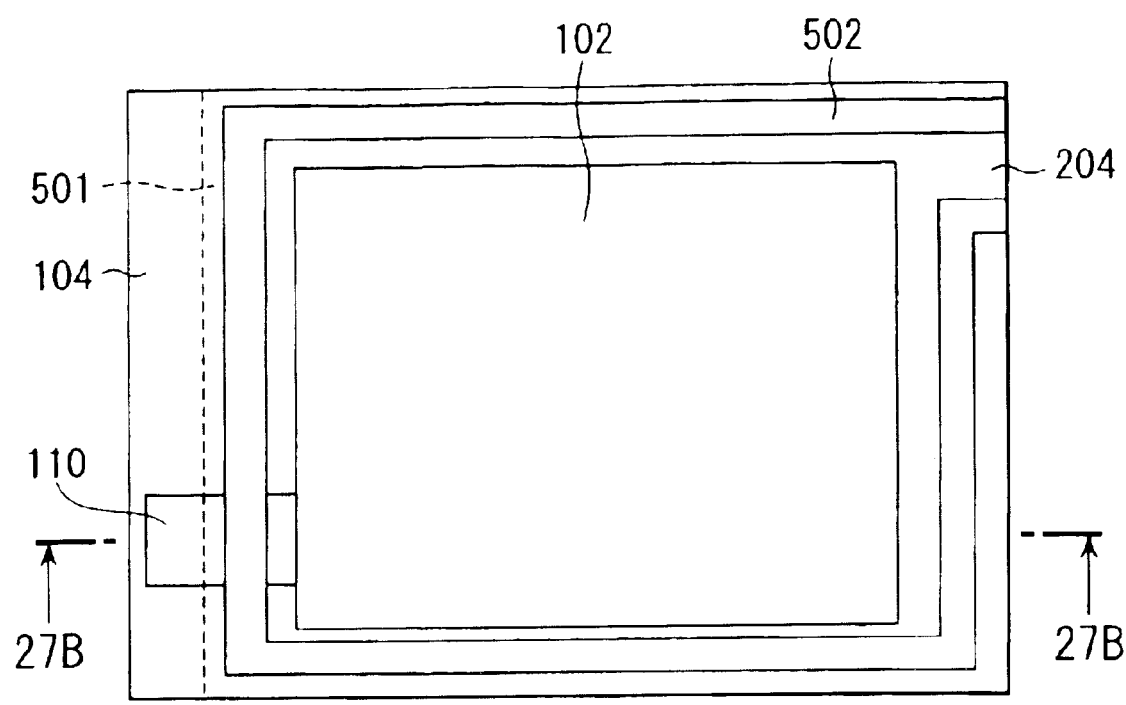
Figure 27B:
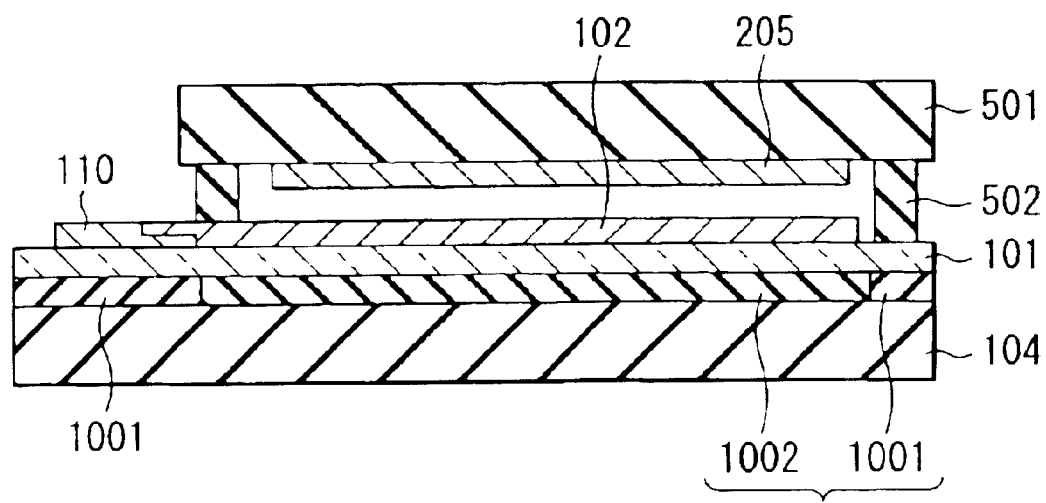

As shown in FIGS. 27A and 27B, a plastic substrate 501 on which a common electrode 205 is formed and the first non-alkaline glass substrate 201 on which the active element circuit region 102 and connecting pad electrode 110 are formed are coupled and bonded by hardening the seal 502, such that the common electrode 205 and active element circuit region 102 oppose each other. Although the materials of the first plastic substrate 104 and plastic substrate 501 are preferably the same, they may be different. The film thickness of the plastic substrate 501 is favorably about 10 $\mu$m to 200 $\mu$m. This plastic substrate 501 can be made of, e.g., an inorganic film such as a silicon oxide film or an organic coating film such as an epoxy-based resin, and is preferably coated. When coating the plastic substrate 501 effectively functions as a barrier against water and gas such as oxygen. Either one or both of the surfaces of this plastic substrate 501 can be coated. In this embodiment, PES is used as the plastic substrate 501, and its surface opposing the common electrode 205 is coated with a silicon oxide film about 50 nm to 500 nm thick.

Figure 28A:
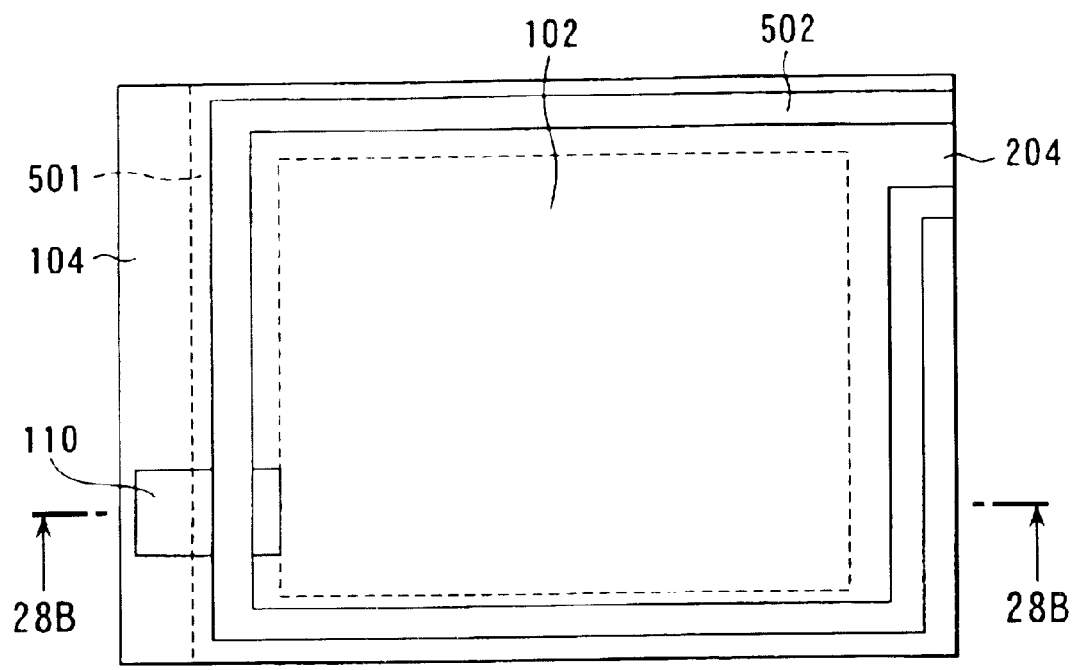
Figure 28B:
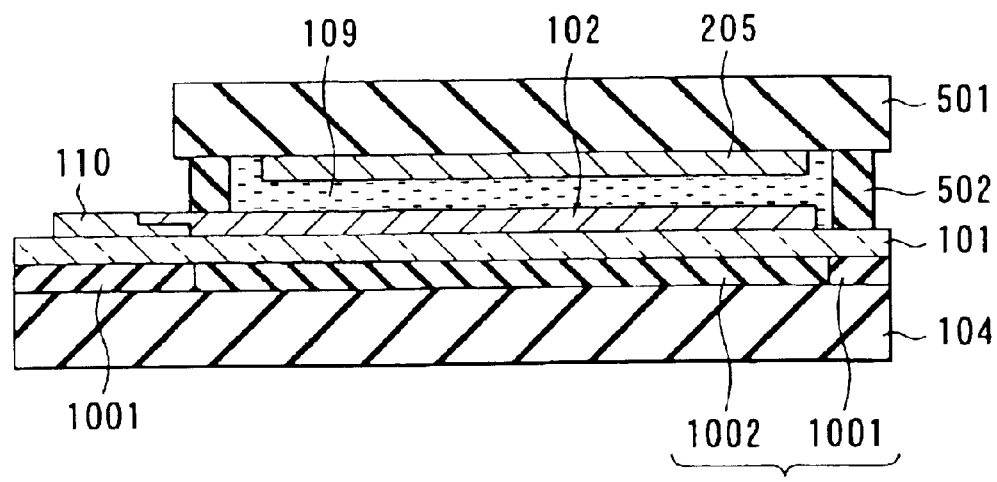
Figure 29A:
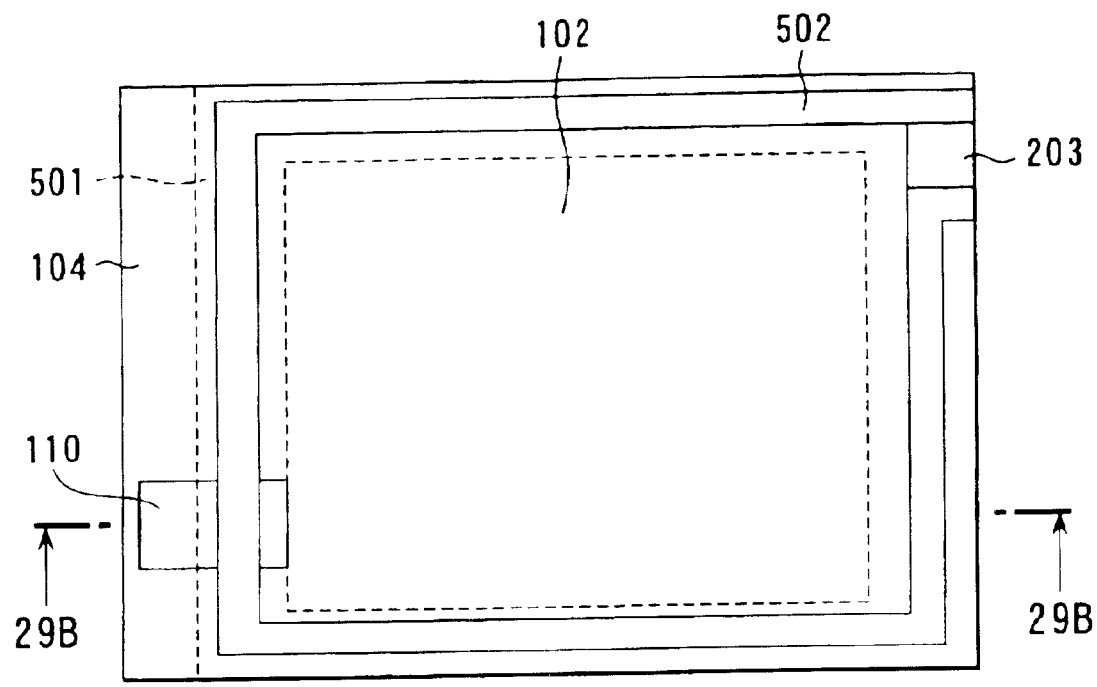
Figure 29B:
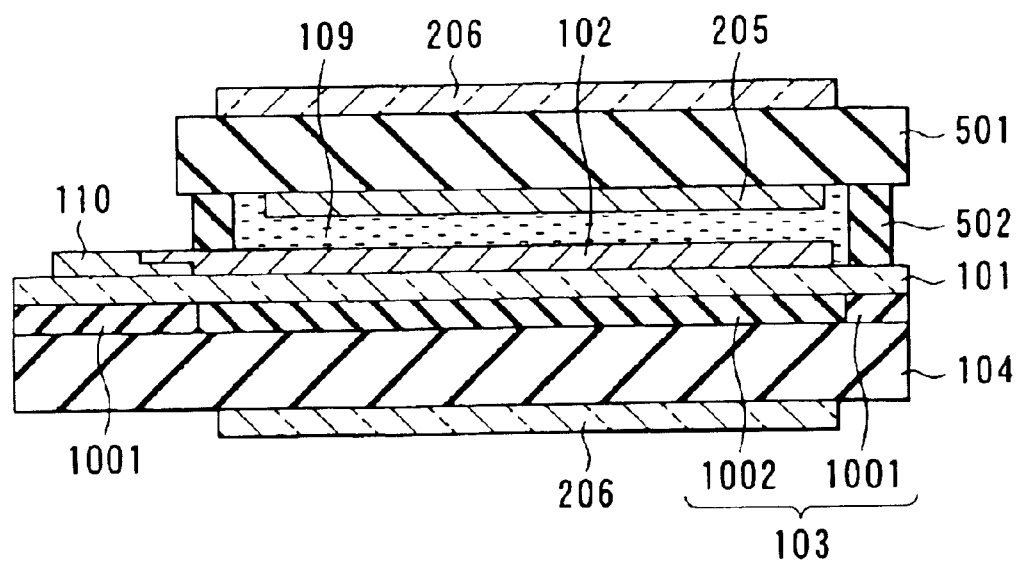

A liquid crystal layer 109 is formed by injecting the liquid crystal from the injection hole 204 shown in FIGS. 28A and 28B, and this injection hole 204 is sealed with a resin 203 as shown in FIGS. 29A and 29B. In this structure shown in FIGS. 29A and 29B, polarizers 206 are bonded to the first plastic substrate 104 and plastic substrate 501. However, these polarizers need not be directly bonded to these substrates.

The active matrix type display device of this embodiment can achieve the same effects as in the first embodiment. Also, only the common electrode 205 is formed, and the plastic substrate 501 is used as a substrate which is not subjected to a high-temperature process. Since this further increases the strength, the display device can be bent with a small radius of curvature. Furthermore, the number of steps can be reduced because the plastic substrate 501 can be directly formed without any steps of thinning and bonding a glass substrate.

(Seventh Embodiment)

Figure 30A:
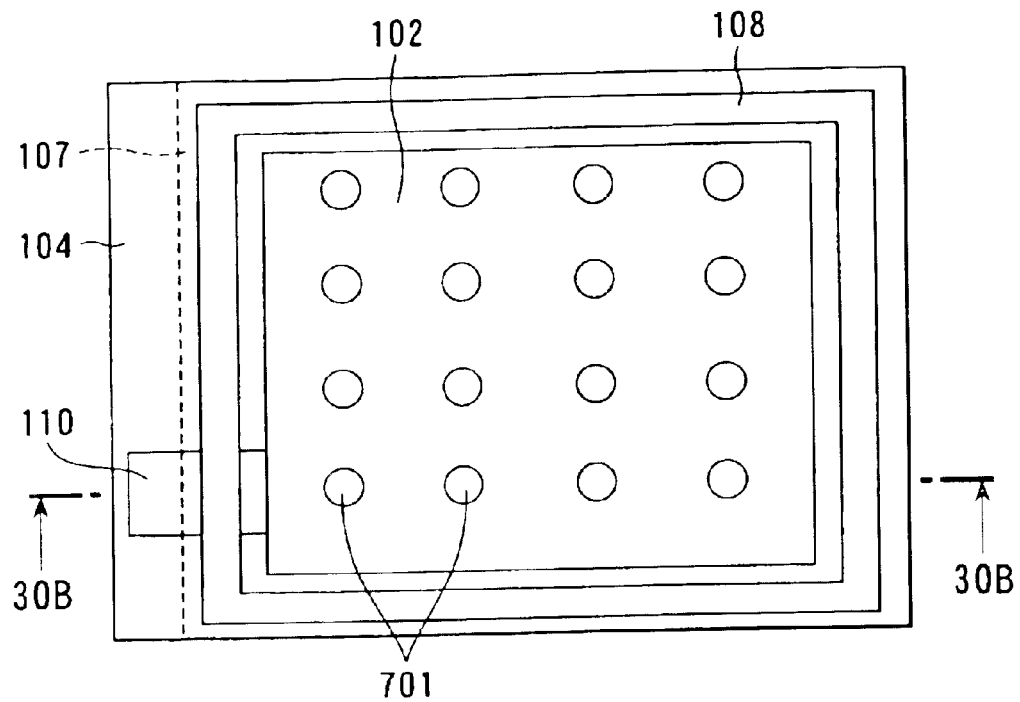
FIG. 30A is a plan view of an active matrix type display device according to the seventh embodiment.
Figure 30B:
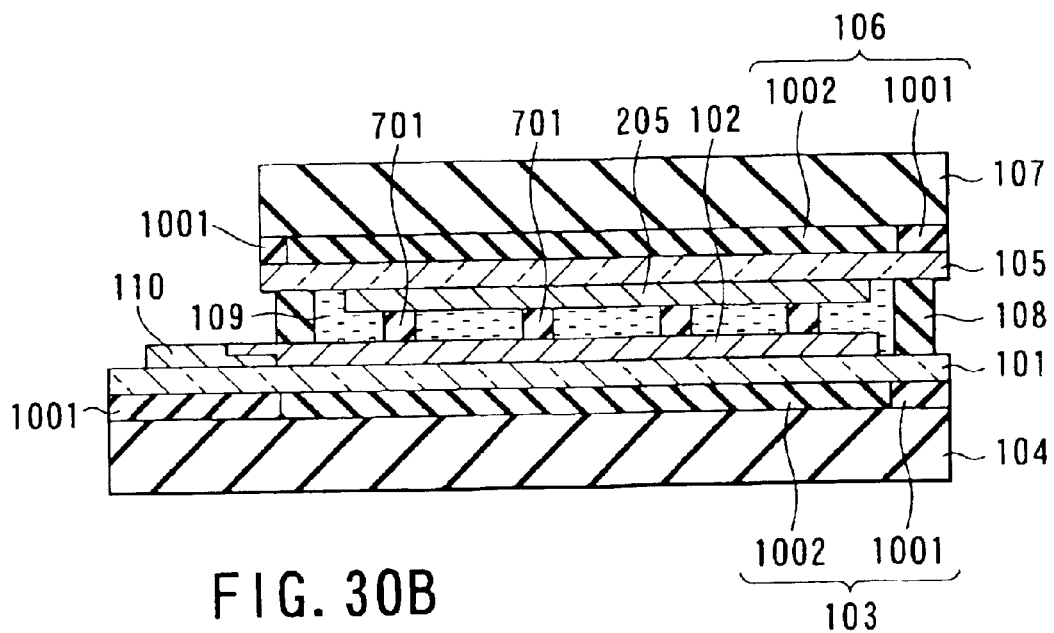
FIG. 30B is a sectional view taken along a line 30B—30B in FIG. 30A.

As shown in FIGS. 30A and 30B, an active matrix type display device of the seventh embodiment differs from the first embodiment in that a plurality of adhesive resin members 701 are formed between an active element circuit region 102 and common electrode 205. These adhesive resin members 701 are formed so that a first plastic substrate 104 having the active element circuit region 102 formed on it and a second plastic substrate 107 having the common electrode 205 formed on it are bonded not only on the perimeters of these substrates but also on their inside surfaces. The adhesive resin members 701 are scattered at predetermined intervals in the pixel region.

More specifically, before the first plastic substrate 104 on which the active element circuit region 102 is formed and the second plastic substrate 107 on which the common electrode 205 is formed are coupled, a plurality of adhesive resin members are formed in appropriate positions on the active element circuit region 102. When these adhesive resin members 701 are formed on the active element circuit region 102 by using a thermoplastic resin, the active element circuit region 102 and common electrode 205 are bonded by heat and pressure when the two substrates are coupled.

Pillars 311 formed in the first embodiment keep the distance between the two substrates, and these pillars 311 and the adhesive resin members 701 can be independently formed. That is, both the pillars 311 and adhesive resin members 701 may be formed. This construction is preferable since the height is held constant when the adhesive resin members 701 are processed with heat and pressure.

The adhesive resin members 701 need not be made of a single material. That is, it is possible to form adhesion layers on the upper and lower surfaces of a resin spacer which hardly deforms, and attach these upper and lower adhesion layers to the active element circuit region 102 and common electrode 205.

The adhesive resin members 701 can be pillars having a diameter of about 3 $\mu$m to 20 $\mu$m, ellipses, or a rib structure formed into stripes on the display surface. Although the pitch (interval) of these adhesive resin members 701 can be one pixel, it can also be about 10 pixels. As the material of the adhesive resin members 701, it is possible to use, e.g., an acrylic resin, polyethylene, polycarbonate, or so-called hot-melt type resin.

In this embodiment, the first and second plastic substrates are bonded and fixed not only on their perimeters but also on their inside surfaces. Therefore, when the display device expands or contracts by bending, the stress can be effectively released to the opposing substrate via the adhesion resin members. This makes a thin glass layer difficult to break.

(Eighth Embodiment)

Figure 31A:
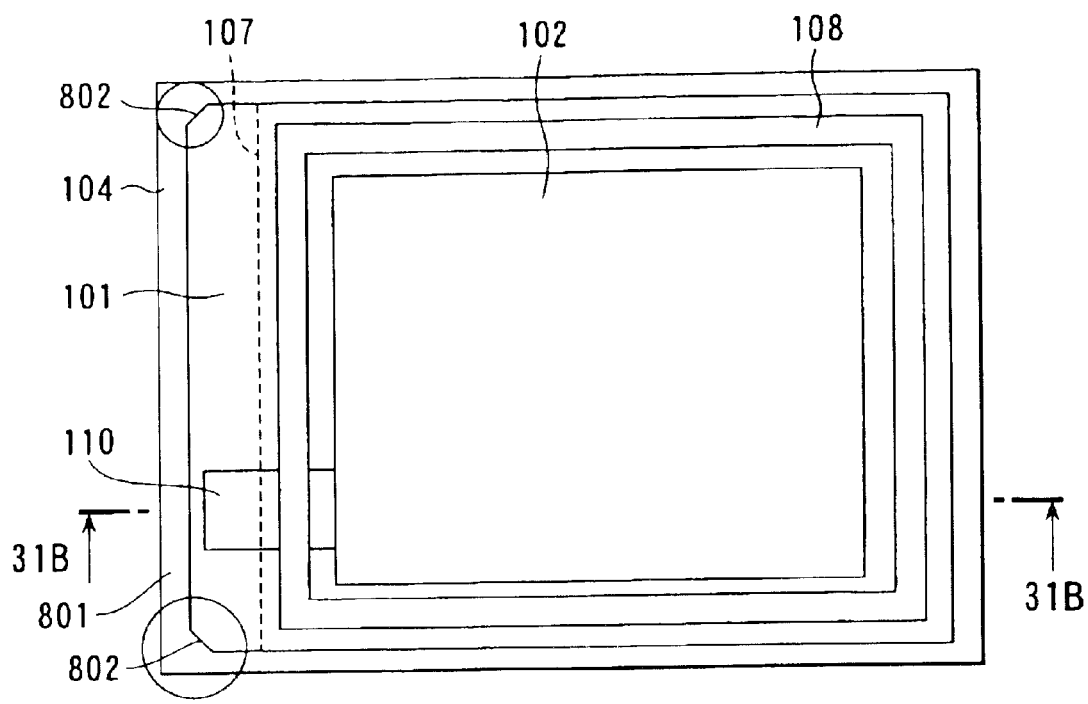
FIG. 31A is a plan view of an active matrix type display device according to the eighth embodiment.
Figure 31B:
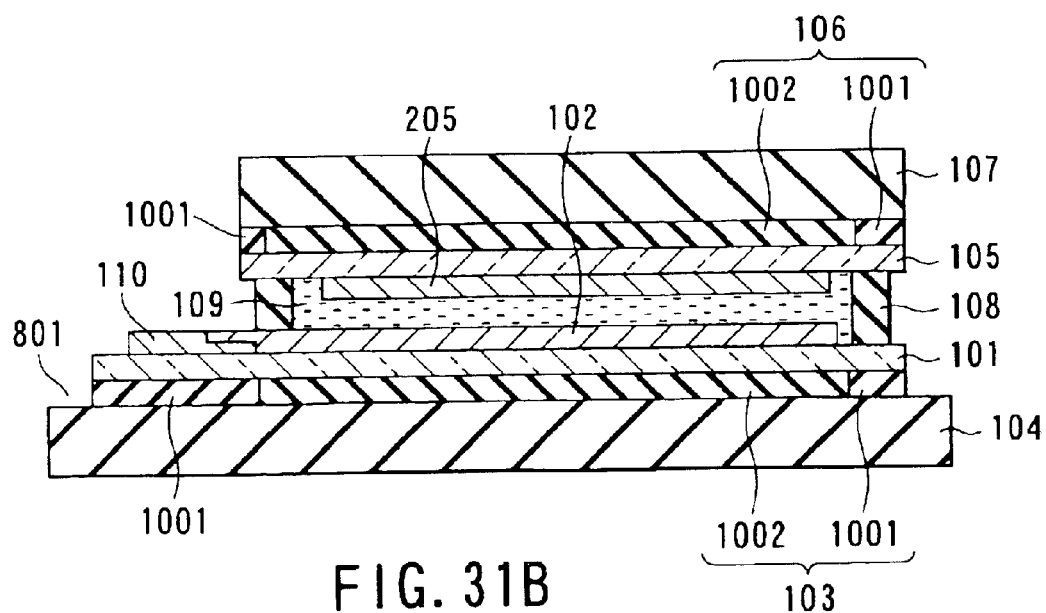
FIG. 31B is a sectional view taken along a line 31B—31B in FIG. 31A.

As shown in FIGS. 31A and 31B, an active matrix type display device of the eighth embodiment differs from the first embodiment in that a first plastic substrate 104 is larger than a first thin glass layer 101 when viewed in a direction perpendicular to the substrate surface. This first plastic substrate 104 is formed to the outside of the first thin glass layer 101 on which an active element circuit region 102 is formed. Each side of the first plastic substrate 104 is preferably larger by about 1 mm to 10 mm than the corresponding side of the first thin glass layer 101. This prevents impact to the first thin glass layer 101 in the directions of the individual sides. A side (the left side in FIGS. 31A and 31B) on which a connecting pad electrode 110 is formed has a region where a second thin glass layer 105 is not present. This configuration is so effete as a local force is readily applied to the first thin glass layer 101 in this region when the display device is bent. Therefore, the large first plastic substrate 104 is particularly effective in this region. Also, cracking of corners 802 can be prevented by cutting the first thin glass layer 101 in these corners 802 or rounding the corners 802.

The active matrix type display device of this embodiment can be manufactured by thinning a first non-alkaline glass substrate by mechanical polishing or the like to form a first thin glass layer 101, and bonding this first thin glass layer 101 to a plastic substrate 104 having an area larger than the first thin glass layer 101 by using an adhesion layer 103 including a peripheral region adhesion layer 1001 and pixel region adhesion layer 1002. The display device can also be formed by first cutting a first thin glass layer 101 and first plastic substrate 104 to have relatively large areas, and then cutting only the first thin glass layer 101 with, e.g., a laser or diamond cutter from the side of this first thin glass layer 101.

A second plastic substrate 107 may be made larger than a second plastic substrate 105 when viewed in the direction perpendicular to the substrate surface. Alternatively, when viewed in the direction perpendicular to the substrate surface, the plastic layer need not larger on every side but may be larger only on a side where the connecting pad electrode 110 is formed.

(Ninth Embodiment)

Figure 32A:
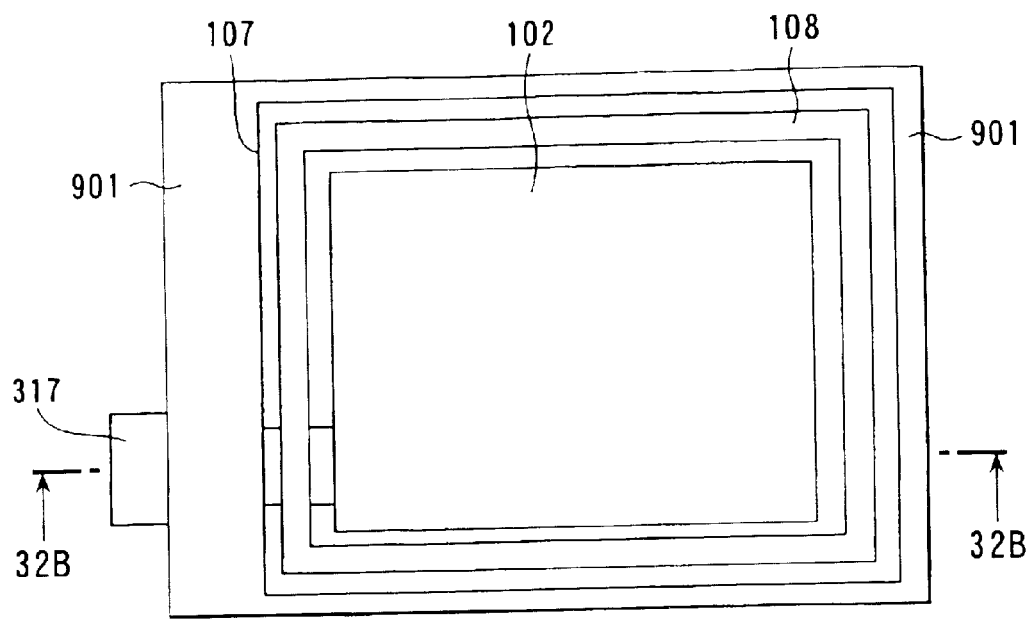
FIG. 32A is a plan view of an active matrix type display device according to the ninth embodiment.
Figure 32B:
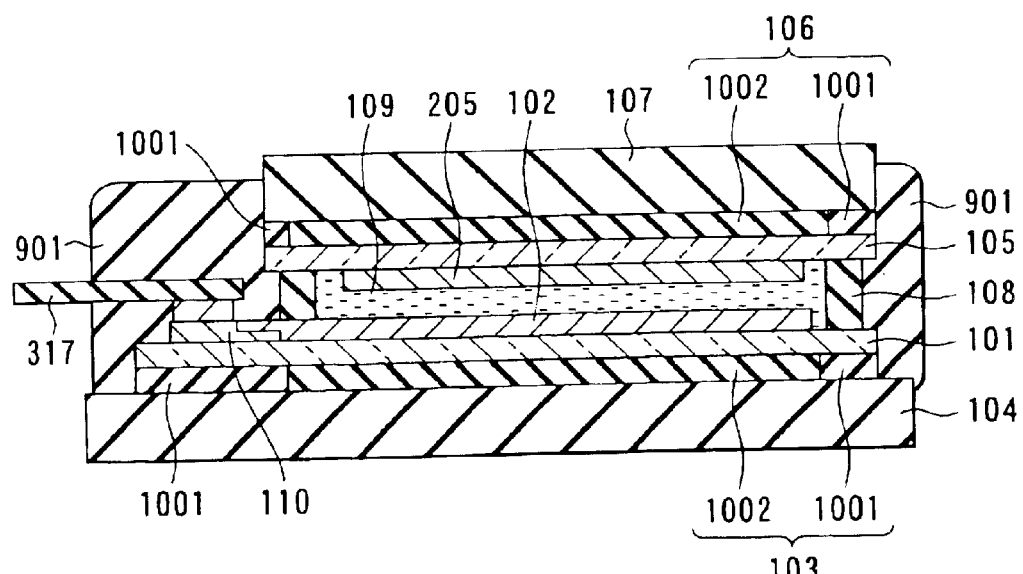
FIG. 32B is a sectional view taken along a line 32B—32B in FIG. 32A.

As shown in FIGS. 32A and 32B, an active matrix type display device of the ninth embodiment differs from the first embodiment in that a protective layer 901 protects not only the circumferences of transfer conductors 313 but also at least a portion from a first plastic substrate 104, which includes a portion from a first adhesion layer 103 to a second adhesion layer 106, to the circumference of a second plastic substrate 107 and the surface of a flexible substrate 317. In this embodiment, after a liquid crystal is injected and a cell is sealed, an ultraviolet ray curable resin such as an acryl-, allyl-, or epoxy-based resin is applied as the protective layer 901 and hardened. As this protective layer 901, an elastic resin such as a rubber- or silicone-based resin may be used. The regions covered with the protective layer 901 need not be transparent because these regions are the side surfaces of the display device and hence do not largely participate in display. Referring to FIGS. 32A and 32B, the first plastic substrate 104 is larger than a first thin glass layer 101 when viewed in a direction perpendicular to the substrate surface. However, the first plastic substrate 104 and first thin glass layer 101 can have the same size.

Those surfaces of the first thin glass layer 101 and a second thin glass layer 105, which are bonded to the first and second plastic substrates 104 and 107, respectively, are improved in strength because they are bonded. However, the strength of those surfaces of the first and second thin glass layers 101 and 105, which oppose a liquid crystal layer 109, is slightly low. In this embodiment, in a region outside a seal 108 the protective layer 901 protects and fixes the surfaces and side surfaces of the first and second thin glass layers 101 and 105, thereby improving the strength in the peripheral region. Even when the distance from the seal 108 to the edges of the first and second thin glass layers 101 and 105 is about 1 mm to 10 mm, cracking is prevented and the strength improves. Also, the bending strength is twice or more that when no protective layer 901 is formed. For example, when the film thickness of the first thin glass layer 101 was about 50 µm, the display device could be stably bent until the radius of curvature was about 100 mm with no protective layer 901 formed. When the protective layer 901 was formed using an acryl-based adhesive, the display device could be bent until the radius of curvature was about 50 mm.

(10th Embodiment)

Figure 33:
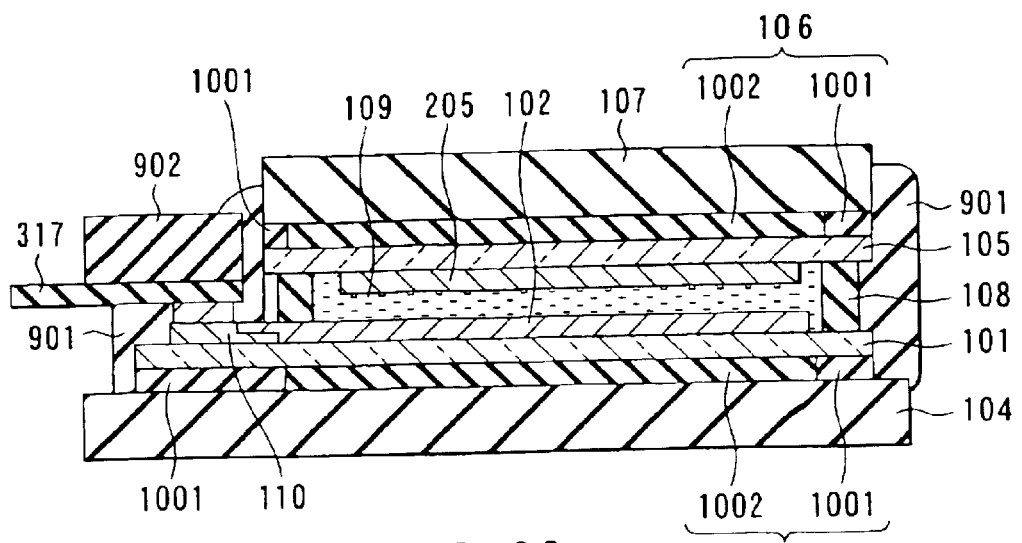
FIG. 33 is a sectional view of an active matrix type display device according to the 10th embodiment.

As shown in FIG. 33, an active matrix type display device of the 10th embodiment differs from the ninth embodiment in that the peripheral region is protected by using not only a protective layer 901 but also a plastic film 902. In particular, a plastic film 902 made of, e.g., PES or PEN is preferably bonded by using an adhesive on a first thin glass layer 101 in a region in which a connecting pad electrode 110 and flexible substrate 317 are formed. As the material of this plastic film 902, an acrylic resin, polyolefin resin, polyimide resin, or the like can be used. Also, as the method of bonding the plastic film 902, melt adhesion of the material itself can also be used.

In this embodiment, the structure is thus further protected by the plastic film 902. Therefore, even if the strength is insufficient with the protective layer 901 alone, the strength of the peripheral region on the first thin glass layer can be increased.

(11th Embodiment)

Figure 34:
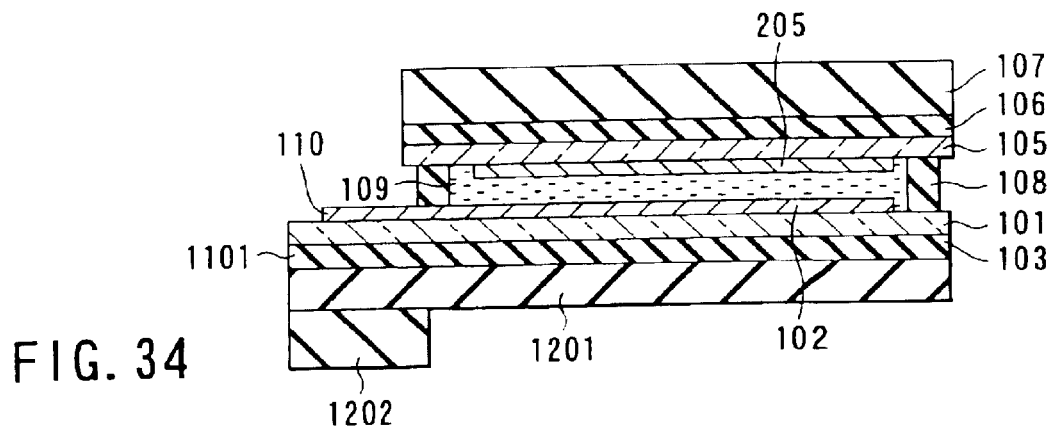
FIG. 34 is a sectional view of an active matrix type display device according to the 11th embodiment.

In the 11th embodiment, as shown in FIG. 34, a structure in which a partial reinforcing substrate is formed on the rear surface of a first plastic substrate will be explained as a modification of the second embodiment.

A first thin glass layer 101 having an active element circuit region 102 formed on it is formed in the same manner as in the second embodiment. On the entire rear surface of this first thin glass layer 101, a first plastic substrate 1201 is bonded via an adhesion layer 103. This adhesion layer 103 can be a photo-setting adhesive such as an ultraviolet ray curable resin, a two-part adhesive, a thermosetting adhesive, or the like. The method of adhesion can be any known method and is not particularly limited.

A third plastic substrate 1202 for reinforcement is bonded to a region of the first plastic substrate 1201 in which a connecting pad 110 is to be formed. The linear expansion coefficient of this third plastic substrate is smaller than that of the first plastic substrate. In this embodiment, a plastic substrate made of, e.g., PEN whose linear expansion coefficient is as small as 2 ppm/° C. to 40 ppm/° C. is used as the third plastic substrate 1202.

As the first plastic substrate, a transparent substrate having a linear expansion coefficient of 30 ppm/° C. (inclusive) to 60 ppm/° C. (inclusive), which is larger than that of the third plastic substrate, is used. The first and third plastic substrates may be bonded by a method which melts the substrates by heat fusing or a solvent, instead of the method using an adhesive. The thickness of the first plastic substrate is 10 µm to 100 µm. Although the third plastic substrate is preferably thicker than the first plastic substrate, it may be thin, so that the thickness of this third plastic substrate is desirably as large as 50 μm to 200 μm.

In this embodiment, the third plastic substrate reduces stress application with respect to heat in the peripheral portion and makes thermal deformation hard to occur. The reliability of connection also improves. In particular, the strength of a portion where opposing substrates 107 and 105 do not exist improves. Additionally, the first plastic substrate can be bonded to the entire surface of the first thin glass layer 101. So, the strength rises when the first plastic substrate is bonded, and this improves the manufacturing yield. This also facilitates bonding the first plastic substrate on a large substrate. The third plastic substrate may be bonded after a cell is cut out.

Figure 35:
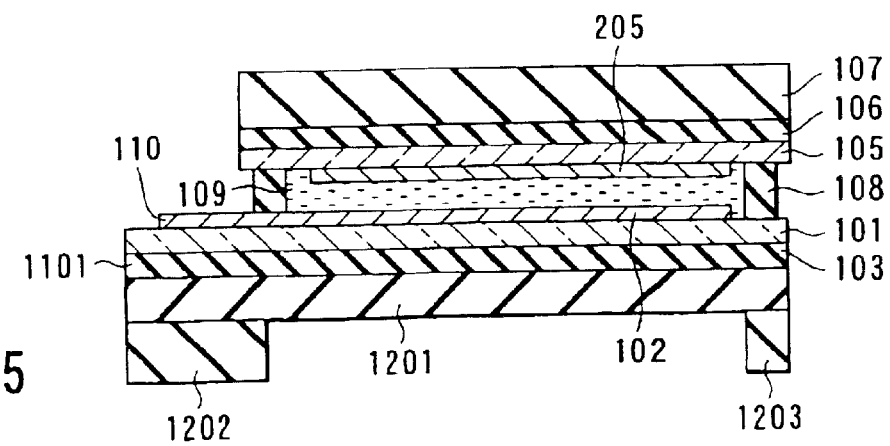
FIG. 35 is a sectional view of an active matrix type display device according to a modification of the 11th embodiment.

FIG. 35 is a modification of the 11th embodiment. This modification is the same as FIG. 34 except that a fourth plastic substrate 1203 for reinforcement is formed in a peripheral portion, in addition to a pad portion. This reduces deformation of the peripheral portion.

Figure 36:
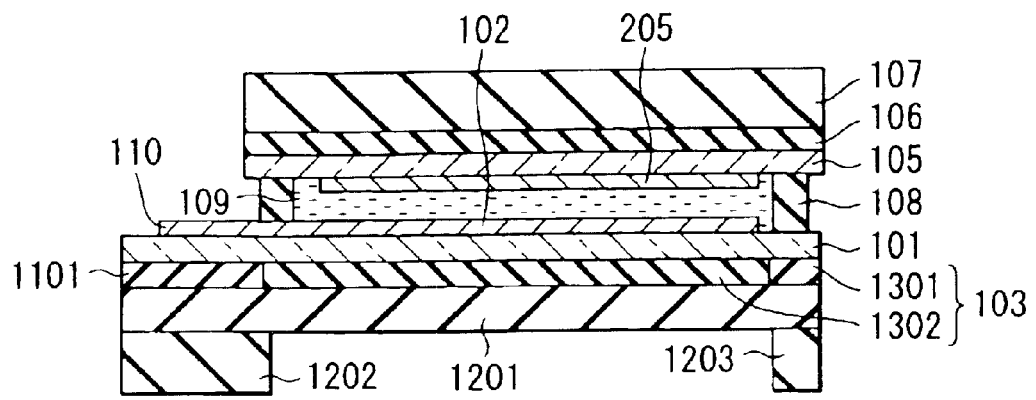
FIG. 36 is a sectional view of an active matrix type display device according to another modification of the 11th embodiment.

FIG. 36 shows another modification. An adhesion layer is two-dimensionally split into two parts. As in the first embodiment, a first adhesion layer 1301 has a high glass transition temperature, and a second adhesion layer 1302 has a low glass transition temperature. A first plastic substrate 1201 is bonded to the entire surface of a first thin glass plate 101, and third and fourth plastic substrates 1202 and 1203 are bonded to a pad portion and peripheral portion, respectively. The third and fourth plastic substrates desirably have a small linear expansion coefficient and can effectively suppress deformation of the first plastic substrate together with the adhesion layer 1301.

The adhesion layer 1301 has a glass transition temperature of 90° C. to 110° C., a linear expansion coefficient of 10 ppm/° C. to 70 ppm/° C., and a Young's modulus of 0.8 GPa to 2 GPa. The adhesion layer 1302 has a glass transition temperature of 45° C. to 60° C., a linear expansion coefficient of 100 ppm/° C. to 300 ppm/° C., and a Young's modulus of 0.4 GPa to 0.8 GPa. The film thickness is 5 μm to 50 μm. These adhesion layers can be selected in the same manner as in the previous embodiments.

On the first thin glass layer 101, a second thin glass layer 105 and second plastic substrate 107 are formed via a seal 108, and a liquid crystal layer 109 is placed. This is the same as in the first embodiment.

(12th Embodiment)

Figure 37A:
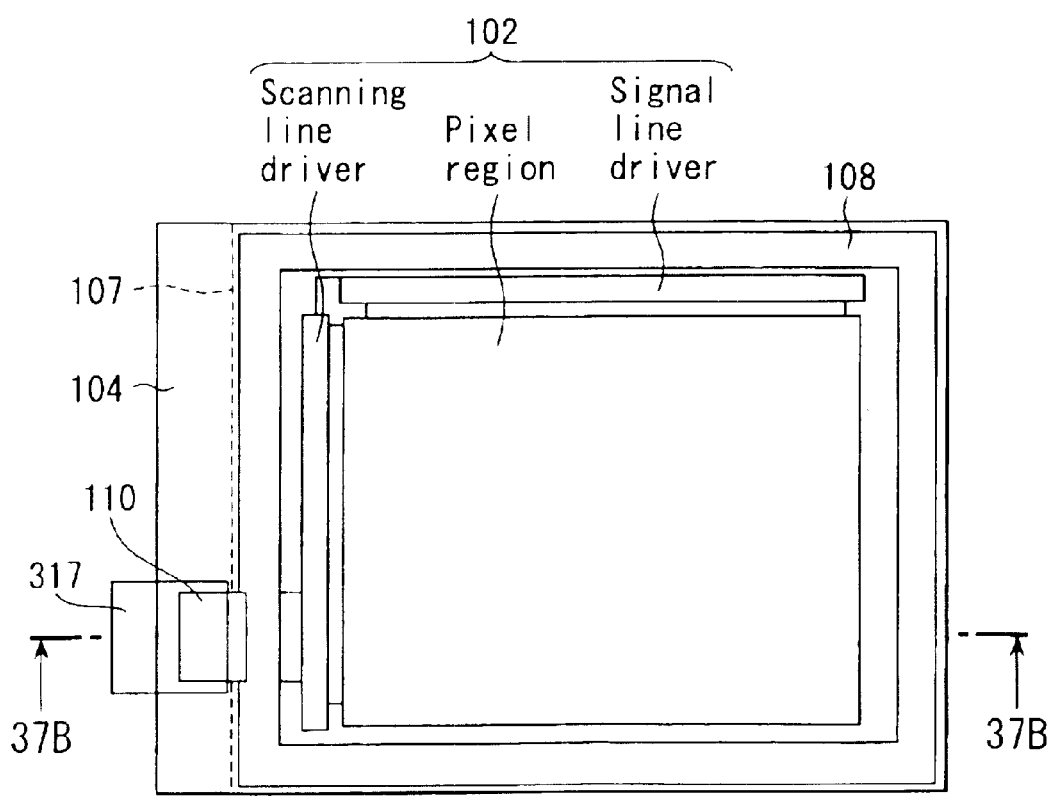
FIG. 37A is a plan view showing the element arrangement of an active matrix type display device according to the 12th embodiment.
Figure 37B:
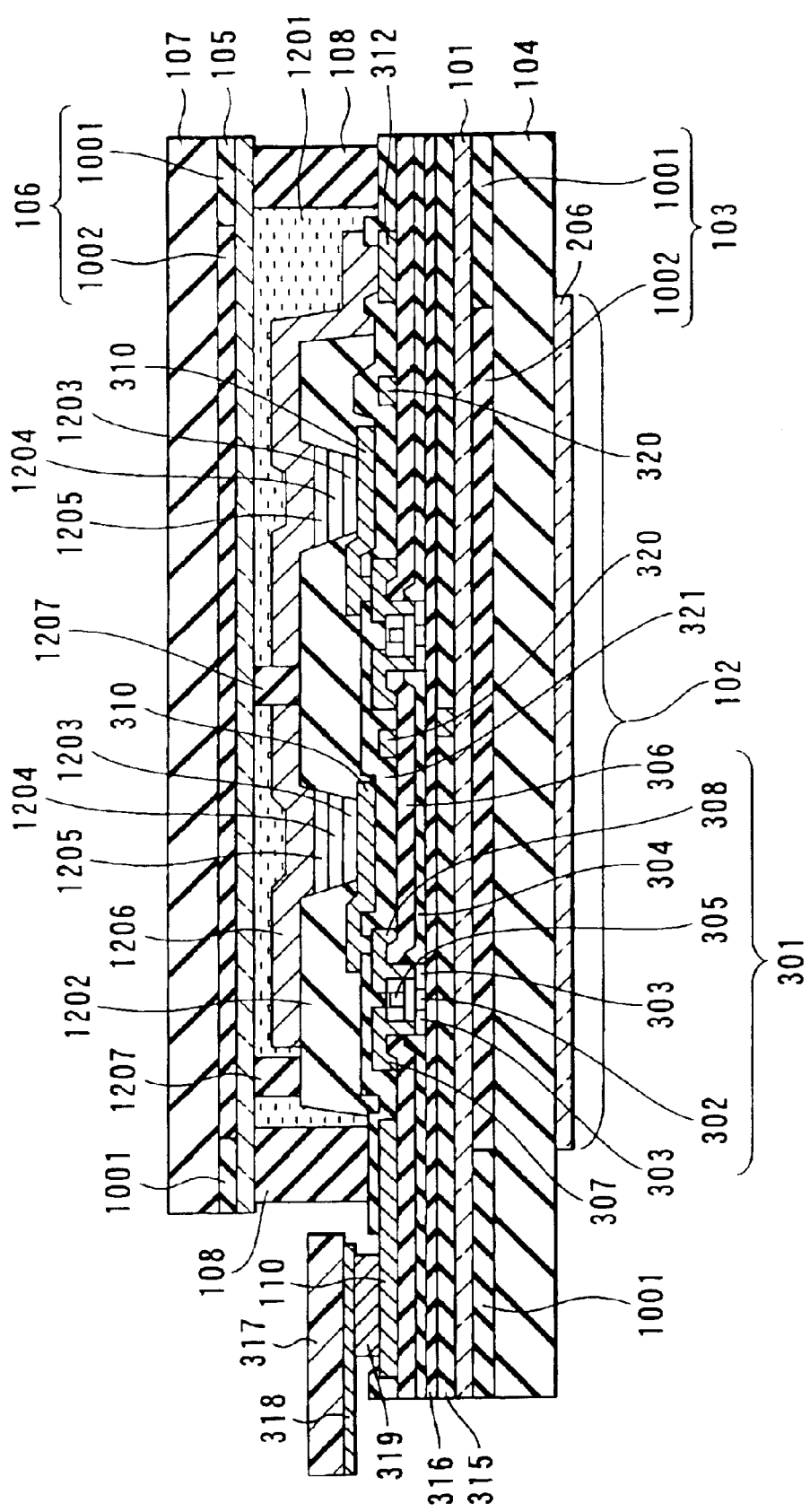
FIG. 37B is a sectional view taken along a line 37B—37B in FIG. 37A.

In the first to 11th embodiments described above, a liquid crystal is used as a display part. However, the display part is not restricted to a liquid crystal. As shown in FIGS. 37A and 37B, the 12th embodiment uses an organic EL as the display part. When an organic EL is used, it is preferable to use a current-driven type peripheral driver and, in each pixel, a 2- to 6-transistor selecting switch, current supply driving transistor, and transistor characteristic variation correction circuit. These circuit configurations can be any conventionally used circuits, so details of these circuits will be omitted. Electrophoretic elements may be used in the display part. Even when a liquid crystal is used as the display part, it is also possible to use a method in which a pair of comb-like pixel electrodes are formed on the side of an element circuit region without forming any counter common electrode, and electric charge is applied in the direction of the display surface to drive the liquid crystal.

Of the arrangement shown in FIG. 37B, only that structure above a passivation film 321, which is different from FIG. 14B will be explained.

As shown in FIG. 37B, pixel electrodes 310 connecting to drain electrodes 308 via through holes formed in the passivation film 321 are formed on the passivation film 321, and an insulating layer 1202 is formed on an entire prospective pixel region. In holes formed in those regions of the insulating layer 1202, which correspond to the pixel electrodes 310, a hole transporting layer 1203, light emitting layer 1204, and electron injecting layer 1205 are stacked in this order. A common electrode 1206 is then formed on the entire surface. This common electrode 1206 electrically connects to the electron injecting layer 1205 of each pixel and also electrically connects to an electrode 312. A second thin glass layer 105 is formed on a gap 1201 above the common electrode 1206. A spacer 1207 is formed between the insulating layer 1202 and second thin glass layer 105 to hold the distance between the substrates.

In a method of manufacturing the active matrix type display device of this embodiment, the arrangement above the passivation film will be explained.

Through holes are formed in the passivation film 321, and pixel electrodes which connect to the drain electrodes 308 through these through holes are formed by a transparent conductive film made of, e.g., ITO. An acryl-based photosensitive resin is formed on the entire surface to have a film thickness of about 2 μm to 8 μm, thereby forming an insulating layer 1202. This insulating layer 1202 is irradiated with light to form holes in regions corresponding to the pixel electrodes 310. Into each hole, droplets of a hole transporting layer 1203, light emitting layer 1204, and electron injecting layer 1205 are sequentially dropped by an inkjet method or the like. The thickness of the insulating layer 1202 is preferably large because the hole transporting layer 1203, light emitting layer 1204, and electron injecting layer 1205 are stacked in the holes described above. As the light emitting layer 1204, a polyparaphenylenevinylene-, polyallylene-, or polyfluorene-based light emitting material can be used. As the hole transporting layer 1203, polyethylene-dioxythiophene-polystyrene-sulfonic acid salt (PEDT/PSS) or the like can be used. As the electron injecting layer 1205, it is possible to use, e.g., an oxadiazole derivative (OXD), PBD, triazoles (TAZ), phenylquinoxaline, or Alq. However, the materials are not limited to those enumerated above.

Subsequently, a common electrode 1206 electrically connecting to the electron injecting layer 1205 of each pixel is formed on the entire surface. This common electrode electrically connects to the electrode 312 to apply the voltage of this electrode 312 to the electron injecting layer 1205. As the common electrode 1206, it is possible to use, e.g., a metal or alloy having a low work function and covered with a metal or alloy for a line, Al—Ca, Al—Li, or ITO. It is also possible to switch the electron injecting layer and hole transporting layer, i.e., to stack the electron injecting layer, light emitting layer, and hole transporting layer in this order from below. Furthermore, a transparent common electrode may be used to emit light from the upper surface.

A seal 108 is formed around the pixel region. An array substrate (formed by bonding a first plastic substrate 104 to a first thin glass layer 101) on which parts up to the common electrode 1206 are formed is bonded to an opposing substrate (formed by bonding a second plastic substrate 107 to a second thin glass layer 105). As the seal 108, it is possible to use, e.g., an ultraviolet ray curable resin mixed with inorganic fillers having a reduced gas permeability can be used. After the two substrates are coupled, this seal 108 is hardened and bonded by irradiation with ultraviolet rays. A gas such as dried nitrogen can be sealed in a gap 1201 between the two substrates. Furthermore, a getter agent for water or oxygen, e.g., a desiccant or oxygen absorbent may be formed on the surface or on a portion of the second thin glass layer 105, and high-purity grease or organic liquid may be sealed.

A display device using an organic EL must be entirely sealed to prevent deterioration of the electrodes, light emitting layers 1204, and the like under the influence of the atmosphere such as water and oxygen. In this embodiment, the first and second thin glass layers 101 and 105 can prevent permeation of, e.g., water and oxygen from the substrate surfaces. These thin glass layers are preferably made of non-alkaline glass. A thin glass layer about 1 $\mu$m to 150 $\mu$m thick can prevent permeation of gases. When the spacer 1207 is formed on the insulating layer 1202 by using a photosensitive organic resin or the like, the distance between the two layers can be held constant. As in the first embodiment, the characteristics of the adhesion layer in the pixel region are different from those of the adhesion layer in the peripheral region. Accordingly, the same effects as in the first embodiment can also be obtained.

The sixth to 12th embodiments described above are explained as modifications of the first embodiment, but these embodiments are not limited to modifications of the first embodiment. That is, the sixth to 12th embodiments may be modifications of the second embodiment in which the properties of the plastic substrate in the pixel region are different from those of the plastic substrate in the peripheral region, modifications of the third embodiment in which the properties of both the adhesion layer and plastic substrate in the pixel region are different from those of the adhesion layer and plastic substrate in the peripheral region, modifications of the fourth embodiment in which the properties of the plastic substrate in the pixel region are different from those of the plastic substrate in the peripheral region and the plastic substrates in these two regions overlap each other, or modifications of the fifth embodiment in which the properties of both the adhesion layer and plastic substrate in the pixel region are different from those of the adhesion layer and plastic substrate in the peripheral region and the plastic substrates in these two regions overlap each other.

Furthermore, the display device manufacturing method of each embodiment may be the method of the first embodiment by which first and second non-alkaline glass substrates are first coupled and then thinned to form thin glass layers, or may be a method by which a first non-alkaline glass substrate having an element circuit region and the like formed on it is first bonded to an intermediate substrate via a temporary adhesion layer and then thinned to form a first thin glass layer, this first thin glass layer is bonded to a first plastic substrate, and then the temporary adhesion layer is removed. In this case, the manufacturing steps as shown in FIGS. 3A and 3B through 6A and 6B is firstly performed to thin the element formation substrate 201, thereby obtaining the thin glass substrate 101. Then, as shown in FIGS. 27A and 27B, the opposing substrate 501, for example, is opposed to the thin glass substrate 101 to form a display cell. Thereafter, the plastic substrate 104 is bonded to the thin glass substrate 101 to complete a display device.

As has been described in detail above, the present invention can provide an active matrix type display device by which active elements can be formed with high yield by using a plastic substrate which is light in weight, and a method of manufacturing the same.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A display device manufacturing method comprising:
    forming active elements in one-to-one relation with pixels on an element formation substrate made of glass;
    thinning the element formation substrate by polishing after said forming the active elements;
    bonding the element formation substrate to a plastic substrate via a first adhesion layer in a pixel region and via a second adhesion layer in a peripheral region outside of the pixel region; and
    opposing the element formation substrate with an opposing substrate to form a display part driven by the active elements and displaying an image in units of pixels.

2. The method according to claim 1, wherein a glass transition temperature of the first adhesion layer is 30° C. (inclusive) to 80° C. (inclusive), and a glass transition temperature of the second adhesion layer is higher by not less than 10° C. than that of the first adhesion layer, and is 80° C. (exclusive) to 200° C. (inclusive).

3. The method according to claim 1, wherein said thinning the element formation substrate is performed after said opposing the element formation substrate with the opposing substrate, and said bonding the plastic substrate to the element formation substrate is performed after said thinning the element formation substrate.

4. The method according to claim 1, further comprising thinning the opposing substrate made of glass after said opposing the element formation substrate with the opposing substrate.

5. A display device manufacturing method comprising:
    forming active elements in one-to-one relation with pixels on an element formation substrate made of glass;
    thinning the element formation substrate by polishing after said forming the active elements;
    bonding a first plastic substrate to the element formation substrate at least in a pixel region via an adhesion layer, and bonding a third plastic substrate to the element formation substrate or the first plastic substrate in a peripheral region outside of the pixel region via the adhesion layer; and
    opposing the element formation substrate with an opposing substrate to form a display part driven by the active elements and displaying an image in units of pixels.

6. The method according to claim 5, wherein a linear expansion coefficient of the first plastic substrate is 30 ppm/° C. (inclusive) to 300 ppm/° C. (inclusive), and a linear expansion coefficient of the third plastic substrate is not more than ⅔ that of the first plastic layer, and is 1 ppm/° C. (inclusive) to 30 ppm/° C. (exclusive).

7. The method according to claim 5, wherein said thinning the element formation substrate is performed after said opposing the element formation substrate with the opposing substrate, and said bonding the first and the third plastic substrate to the element formation substrate is performed after said thinning the element formation substrate.

8. The method according to claim 5, further comprising thinning the opposing substrate made of glass after said opposing the element formation substrate with the opposing substrate.

* * * * *